United States Patent
Takaya et al.

(10) Patent No.: US 11,855,617 B2
(45) Date of Patent: Dec. 26, 2023

(54) ELECTRONIC CIRCUIT AND ELECTRONIC APPARATUS

(71) Applicant: KABUSHIKI KAISHA TOSHIBA, Tokyo (JP)

(72) Inventors: Satoshi Takaya, Kawasaki Kanagawa (JP); Hiroaki Ishihara, Yokohama Kanagawa (JP); Kohei Onizuka, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 491 days.

(21) Appl. No.: 17/187,619

(22) Filed: Feb. 26, 2021

(65) Prior Publication Data

US 2022/0004218 A1 Jan. 6, 2022

(30) Foreign Application Priority Data

Jul. 2, 2020 (JP) .................. 2020-114811

(51) Int. Cl.
| | | |
|---|---|---|
| H03K 17/68 | (2006.01) | |
| H03F 1/52 | (2006.01) | |
| H03K 17/687 | (2006.01) | |
| H03F 3/195 | (2006.01) | |

(52) U.S. Cl.
CPC ............. *H03K 17/687* (2013.01); *H03F 1/52* (2013.01); *H03F 3/195* (2013.01)

(58) Field of Classification Search
CPC ................................. H03K 17/687; H03F 1/52
See application file for complete search history.

(56) References Cited

U.S. PATENT DOCUMENTS

| | | |
|---|---|---|
| 6,806,623 B2 | 10/2004 | Petersen et al. |
| 7,786,870 B2 | 8/2010 | Zettler |
| 8,283,728 B2 | 10/2012 | Okushima |
| 8,378,663 B2 | 2/2013 | Cadoux et al. |
| 8,390,270 B2 | 3/2013 | Cadoux et al. |
| 10,014,856 B2 | 7/2018 | Uchida et al. |

(Continued)

FOREIGN PATENT DOCUMENTS

| | | |
|---|---|---|
| JP | 2006-326701 A | 12/2006 |
| JP | 4690455 B2 | 6/2011 |

(Continued)

*Primary Examiner* — Patricia T Nguyen
(74) *Attorney, Agent, or Firm* — Finnegan, Henderson, Farabow, Garrett & Dunner, LLP

(57) ABSTRACT an electronic circuit according to an embodiment includes: a generation circuit generating a first clocksignal and a second clocksignal delayed from the first clocksignal; a first coupler transmitting one of the first and the second clocksignals by electromagnetic coupling; a first converter driven by the transmitted clocksignal and converting a first input signal into a first signal of a frequency corresponding to the transmitted clocksignal; a second coupler transmitting the first signal by electromagnetic coupling; a second converter converting the first signal into a second signal of a frequency corresponding to the first input signal with the other of the first and the second clocksignals; an output device outputting the second signal; and a protection circuit connected to a line through which the one of the first and the second clocksignals is transmitted between the first coupler and the first converter.

19 Claims, 17 Drawing Sheets

(56) References Cited

U.S. PATENT DOCUMENTS

| | | | |
|---|---|---|---|
| 10,291,021 B2 | 5/2019 | Sekine et al. | |
| 2008/0311862 A1* | 12/2008 | Spina | H01Q 1/38 |
| | | | 455/78 |
| 2014/0015568 A1* | 1/2014 | Shimamune | H03G 3/3042 |
| | | | 327/103 |
| 2015/0326202 A1* | 11/2015 | Nicholls | H04B 1/28 |
| | | | 327/553 |
| 2016/0087914 A1* | 3/2016 | Goswami | H04B 5/0031 |
| | | | 370/467 |
| 2018/0152254 A1* | 5/2018 | Vaucher | H03G 3/001 |
| 2019/0097592 A1* | 3/2019 | Goktepeli | H01L 27/1203 |
| 2021/0075410 A1 | 3/2021 | Takaya et al. | |
| 2022/0069806 A1* | 3/2022 | Ishihara | H03D 7/161 |

FOREIGN PATENT DOCUMENTS

| | | |
|---|---|---|
| JP | 5577082 B2 | 8/2014 |
| JP | 5692976 B2 | 4/2015 |
| JP | 6272509 B2 | 1/2018 |
| JP | 6566316 B2 | 8/2019 |
| JP | 2021-42996 A | 3/2021 |

\* cited by examiner

ELECTRONIC CIRCUIT AND ELECTRONIC APPARATUS

CROSS-REFERENCE TO RELATED APPLICATION (S)

This application is based upon and claims the benefit of priority from Japanese Patent Application No. 2020-114811, filed Jul. 2, 2020; the entire contents of which are incorporated herein by reference.

FIELD

Embodiments described herein relate generally to an electronic circuit and an electronic apparatus.

BACKGROUND

An electronic circuit that transmits an analog signal between an input device and an output device through isolation has been developed. In the electronic circuit, an analog signal is once converted into a high-frequency signal, the high-frequency signal is transmitted through the isolation by electromagnetic field coupling, and the high-frequency signal is restored to an original analog signal. In the electronic circuit, depending on variation speed of a voltage of an input signal and a reference potential, the electronic circuit may be destroyed due to delay in charging/discharging to/from an internal circuit. It is desirable to provide an electronic circuit that can perform charging/discharging to/from the internal circuit corresponding to variation of the voltage of the input signal and the reference potential.

DETAILED DESCRIPTION

Figure 1:
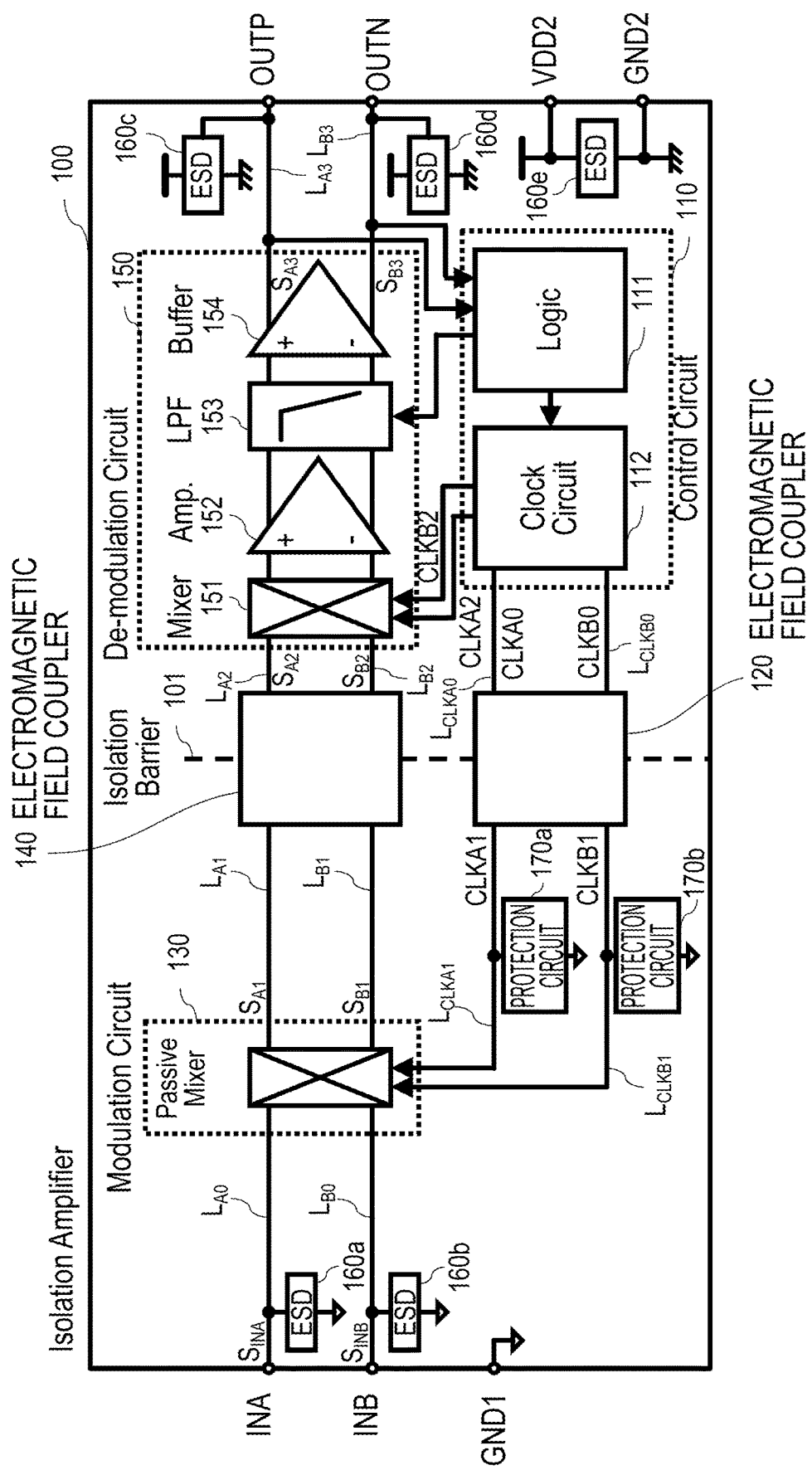
FIG. 1 is a configuration diagram of an electronic circuit 100 according to a first embodiment.

Issues to be solved by embodiments of the present invention are to provide an electronic circuit and an electronic apparatus each adaptive to variation of a potential of an input signal and a reference potential.

To solve the above-described issues, an electronic circuit according to an embodiment includes: a generation circuit configured to generate a first clock signal and a second clock signal delayed from the first clock signal; a first electromagnetic field coupler configured to transmit one of the first clock signal and the second clock signal by electromagnetic field coupling; a first frequency converter driven by the one of the first clock signal and the second clock signal, and configured to convert a first input signal into a first signal of a frequency corresponding to one of the first clock signal and the second clock signal; a second electromagnetic field coupler configured to transmit the first signal by electromagnetic field coupling; a second frequency converter configured to convert the first signal into a second signal of a frequency corresponding to the first input signal, by using the other of the first clock signal and the second clock signal; an output device configured to output the second signal; and a first protection circuit connected to a first line through which the one of the first clock signal and the second clock signal is transmitted between the first electromagnetic field coupler and the first frequency converter.

Some embodiments of the present invention are described below with reference to drawings. The disclosure is merely illustrative, and the invention is not limited by contents described in the following embodiments. Modifications easily conceivable by those skilled in the art are included in the scope of the disclosure as a matter of course. To make the description clearer, sizes, shapes, and the like of parts may be changed from those in actual implementation and schematically illustrated in drawings. In the plurality of drawings, corresponding elements are denoted by the same reference numerals, and detailed descriptions of the corresponding elements may be omitted.

First Embodiment

FIG. 1 is a configuration diagram of an electronic circuit 100 according to a first embodiment. The electronic circuit 100 includes an isolation barrier 101 (illustrated as Isolation Barrier in drawing), and transmits an analog signal through the isolation barrier 101. The electronic circuit 100 is also referred to as an isolation amplifier. In the drawing, the electronic circuit 100 is illustrated as Isolation Amplifier.

In the electronic circuit 100, an input side including input terminals INA and INB and an output side including output terminals OUTP and OUTN are electrically isolated from each other by the isolation barrier 101. The electronic circuit 100 includes, on the input side, a modulation circuit 130 (illustrated as Modulation Circuit in drawing), ESD (Electro-Static Discharge) circuits 160a and 160b, protection circuits 170a and 170b, and a part of each of electromagnetic field couplers 120 and 140. The electronic circuit 100 includes, on the output side, a control circuit 110 (illustrated as Control Circuit in drawing), a de-modulation circuit 150

(illustrated as De-modulation Circuit in drawing), ESD circuits 160c, 160d, and 160e, and a part of each of the electromagnetic field couplers 120 and 140. Further, the input side and the output side are electromagnetic-field coupled by the electromagnetic field coupler 120 and the electromagnetic field coupler 140.

Electric isolation is not limited to complete isolation, and it is sufficient to block electricity at a degree regarded as isolation. In the electronic circuit 100, power is supplied to the output side from a power supply VDD2, whereas power is not supplied to the input side. In other words, the control circuit 110 and the de-modulation circuit 150 are driven by receiving power from the power supply VDD2, whereas the modulation circuit 130 is driven without receiving power. Further, in the electronic circuit 100, the input side and the output side may be different in reference potential because of electric isolation. In this example, the reference potential on the input side is referred to as a reference potential GND1, and the reference potential on the output side is referred to as a reference potential GND2.

Note that the modulation circuit 130 is also referred to as a frequency converter 130 (illustrated as Passive Mixer in drawing).

The control circuit 110 includes a logic circuit 111 (illustrated as Logic in drawing) and a clock circuit 112 (illustrated as Clock Circuit in drawing).

The logic circuit 111 is a circuit transmitting an instruction to each of components of the electronic circuit 100. For example, the logic circuit 111 instructs the clock circuit 112 to generate clock signals CLKA0 and CLKB0, and instructs a frequency to be filtered to a filter circuit 153. The logic circuit 111 determines delay amounts of clock signals CLKA2 and CLKB2 based on amplitudes of signals de-modulated by the de-modulation circuit 150 described below. More specifically, the logic circuit 111 determines the delay amounts of the clock signals CLKA2 and CLKB2 based on the maximum values of the amplitudes of the signals de-modulated by the de-modulation circuit 150. The logic circuit 111 instructs the clock circuit 112 to generate the clock signal CLKA2 that is obtained by delaying a phase of the clock signal CLKA0 by the determined delay amount and the clock signal CLKB2 that is obtained by delaying a phase of the clock signal CLKB0 by the determined delay amount.

The clock circuit 112 generates the clock signals CLKA0 and CLKB0 and the clock signals CLKA2 and CLKB2 that are delayed in phase by the determined delay amounts, in response to the instruction from the logic circuit 111. The clock signal CLKA0 is transmitted to the electromagnetic field coupler 120 through a line $L_{CLKA0}$, and the clock signal CLKB0 is transmitted to the electromagnetic field coupler 120 through a line $L_{CLKB0}$. The clock signals CLKA2 and CLKB2 delayed by the determined delay amounts are transmitted to a frequency converter 151 of the de-modulation circuit 150, and are used for de-modulation of signals.

The electromagnetic field coupler 120 is electromagnetic-field coupled through the isolation barrier 101, and transmits the clock signals CLKA0 and CLKB0 transmitted from the clock circuit 112 to the input side by the electromagnetic field coupling. The clock signals CLKA0 and CLKB0 are shifted in phase in a process of being transmitted by the electromagnetic field coupler 120, and become clock signals CLKA1 and CLKB1. The clock signal CLKA1 is transmitted to the frequency converter 130 through a line $L_{CLKA1}$, and the clock signal CLKB1 is transmitted to the frequency converter 130 through a line $L_{CLKB1}$. The electromagnetic field coupler 120 is realized by, for example, capacitors or transformers facing each other, and the isolation barrier 101 is positioned between the capacitors or the transformers facing each other.

An analog signal is input to each of the input terminals INA and INB. In the following, the analog signal input to the input terminal INA is also referred to as an input signal $S_{INA}$, and the analog signal input to the input terminal INB is also referred to as an input signal $S_{INB}$. The input signal $S_{INA}$ is transmitted to the frequency converter 130 through a line $L_{A0}$, and the input signal $S_{INB}$ is transmitted to the frequency converter 130 through a line $L_{B0}$.

The frequency converter 130 is driven by the clock signals CLKA1 and CLKB1 transmitted from the electromagnetic field coupler 120, converts frequencies of the input signals $S_{INA}$ and $S_{INB}$ to generate high-frequency signals $S_{A1}$ and $S_{B1}$. The frequency converter 130 converts the input signal $S_{INA}$ into the high-frequency signal $S_{A1}$, and converts the input signal $S_{INB}$ into the high-frequency signal $S_{B1}$. Since the frequency converter 130 is driven by the clock signals CLKA1 and CLKB1, the frequency converter 130 does not receive supply of power. Such a frequency converter is also referred to as a passive mixer. The high-frequency signal $S_{A1}$ is transmitted to the electromagnetic field coupler 140 through a line $L_{A1}$, and the high-frequency signal $S_{B1}$ is transmitted to the electromagnetic field coupler 140 through a line $L_{B1}$.

The electromagnetic field coupler 140 is electromagnetic-field coupled through the isolation barrier 101, and transmits the high-frequency signals $S_{A1}$ and $S_{B1}$ transmitted from the frequency converter 130 by the electromagnetic field coupling. The high-frequency signals $S_{A1}$ and $S_{B1}$ are shifted in phase in a process of being transmitted by the electromagnetic field coupler 140, and become high-frequency signals $S_{A2}$ and $S_{B2}$. The high-frequency signal $S_{A2}$ is transmitted to the de-modulation circuit 150 through a line $L_{A2}$, and the high-frequency signal $S_{B2}$ is transmitted to the de-modulation circuit 150 through a line $L_{B2}$. The electromagnetic field coupler 140 is realized by, for example, capacitors or transformers facing each other, and the isolation barrier 101 is positioned between the capacitors or the transformers facing each other.

The de-modulation circuit 150 includes the frequency converter 151 (illustrated as Mixer in drawing), an amplifier 152 (illustrated as Amp. in drawing), a filter circuit 153 (illustrated as LPF in drawing), and a buffer circuit 154 (illustrated as Buffer in drawing).

The frequency converter 151 de-modulates the high-frequency signals $S_{A2}$ and $S_{B2}$ by using the clock signals CLKA2 and CLKB2 transmitted from the clock circuit 112, to generate restoration signals $S_{A3}$ and $S_{B3}$. The restoration signals $S_{A3}$ and $S_{B3}$ are analog signals, frequencies of which are respectively restored to frequencies equivalent to the frequencies of the input signals $S_{INA}$ and $S_{INB}$. The amplifier 152 amplifies the restoration signals $S_{A3}$ and $S_{B3}$ transmitted from the frequency converter 151, and outputs the amplified signals. The filter circuit 153 performs filtering on the restoration signals $S_{A3}$ and $S_{B3}$ transmitted from the amplifier 152. In the present embodiment, as an example, the filter circuit 153 is a low-pass filter. The buffer circuit 154 adjusts signals transmitted from the filter circuit 153.

The restoration signal $S_{A3}$ is output from the output terminal OUTP through a line $L_{A3}$, and the restoration signal $S_{B3}$ is output from the output terminal OUTN through a line $L_{B3}$. Further, the restoration signals $S_{A3}$ and $S_{B3}$ are also transmitted to the logic circuit 111. The restoration signals $S_{A3}$ and $S_{B3}$ are used in the logic circuit 111 to determine delay amounts of the clock signals CLKA0 and CLKB0.

More specifically, since the high-frequency signals $S_{A2}$ and $S_{B2}$ as the origins of the restoration signals $S_{A3}$ and $S_{B3}$ each include phase shift, amplitudes of the restoration signals $S_{A3}$ and $S_{B3}$ may be decreased depending on the delay amounts added to the clock signals CLKA2 and CLKB2. The logic circuit 111 determines the delay amounts not decreasing the amplitudes (correcting phase shift of high-frequency signals $S_{A2}$ and $S_{B2}$) based on the maximum values of the amplitudes of the restoration signals $S_{A3}$ and $S_{B3}$.

The ESD circuits 160a to 160e are circuits protecting the internal circuit of the electronic circuit 100 from voltage variation of static electricity or the like. The ESD circuit 160a is connected to the line $L_{A0}$ and the reference potential GND1. The ESD circuit 160b is connected to the line $L_{B0}$ and the reference potential GND1. The ESD circuit 160c is connected to the line $L_{A3}$, the power supply VDD2, and the reference potential GND2. The ESD circuit 160d is connected to the line $L_{B3}$, the power supply VDD2, and the reference potential GND2. The ESD circuit 160e is connected to the power supply VDD2 and the reference potential GND2. Although the detail is described below, on the input side not receiving supply of power in the electronic circuit 100, the internal circuit of the electronic circuit 100 may not be protected from variation of the voltages of the input signals $S_{INA}$ and $S_{INB}$ and the reference potential GND1.

The protection circuits 170a and 170b are circuits protecting the internal circuit on the input side of the electronic circuit 100 from voltage variation. The protection circuit 170a is connected to the line $L_{CLKA1}$ that connects the electromagnetic field coupler 120 and the frequency converter 130, and the reference potential GND1. The protection circuit 170b is connected to the line $L_{CLKB1}$ that connects the electromagnetic field coupler 120 and the frequency converter 130, and the reference potential GND1. Although the detail is described below, the protection circuits 170a and 170b can protect the internal circuit of the electronic circuit 100 even from variation of the voltages of the input signals $S_{INA}$ and $S_{INB}$ and the reference potential GND1 that may not be protected by the ESD circuits 160a and 160b.

The configuration of the electronic circuit 100 has been described above. The electronic circuit 100 may be implemented by an IC (Integrated Circuit) or an LSI (Large Scale Integration). The electronic circuit 100 may be collectively implemented on one chip or a part of the electronic circuit 100 may be implemented on a different chip. Further, the function of the control circuit 110 may be realized by a processing device such as a processor.

Figure 2:
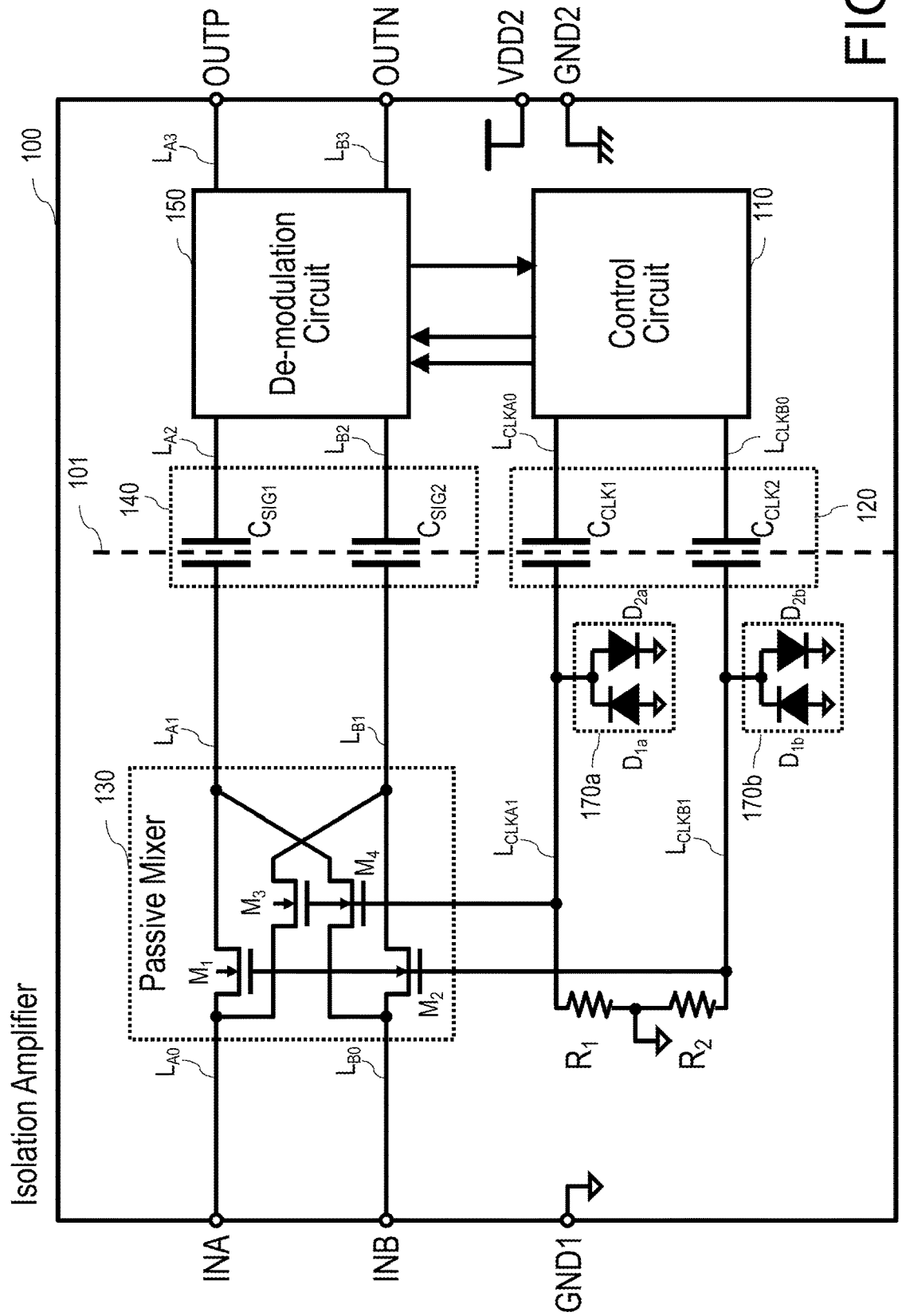
FIG. 2 is a diagram illustrating detail of the electronic circuit 100.

In the following, the electromagnetic field couplers 120 and 140, the frequency converter 130, and the protection circuits 170a and 170b according to the present embodiment are described in detail. FIG. 2 is a detailed diagram of the electronic circuit 100 including the details of the electromagnetic field couplers 120 and 140, the frequency converter 130, and the protection circuits 170a and 170b. In FIG. 2, illustration of the ESD circuits 160a to 160e illustrated in FIG. 1 is omitted.

In the present embodiment, the electromagnetic field couplers 120 and 140 each include capacitors. The electromagnetic field coupler 120 includes capacitors $C_{CLK1}$ and $C_{CLK2}$, and the electromagnetic field coupler 140 includes capacitors $C_{SIG1}$ and $C_{SIG2}$. The capacitors $C_{CLK1}$, $C_{CLK2}$, $C_{SIG1}$, and $C_{SIG2}$ each perform electromagnetic field coupling. One of flat plates of the capacitor $C_{CLK1}$ is connected to the line $L_{CLKA0}$, and the other flat plate is connected to the line $L_{CLKA1}$. One of flat plates of the capacitor $C_{CLK2}$ is connected to the line $L_{CLKB0}$, and the other flat plate is connected to the line $L_{CLKB1}$. One of flat plates of the capacitor $C_{SIG1}$ is connected to the line $L_{A1}$, and the other flat plate is connected to the line $L_{A2}$. One of flat plates of the capacitor $C_{SIG2}$ is connected to the line $L_{B1}$, and the other flat plate is connected to the line $L_{B2}$. The isolation barrier 101 is positioned between the flat plates of each of the capacitors. In the present embodiment, the capacitors are used as each of the electromagnetic field couplers 120 and 140; however, at least one capacitor may be replaced with a transformer.

In the present embodiment, the frequency converter 130 includes four NMOS transistors $M_1$, $M_2$, $M_3$, and $M_4$ (hereinafter, also simply referred to as transistors $M_1$, $M_2$, $M_3$, and $M_4$). Each of the transistors $M_1$ and $M_2$ is driven when the clock signal CLKB1 transmitted through the line $L_{CLKB1}$ is input to a gate terminal. Each of the transistors $M_3$ and $M_4$ is driven when the clock signal CLKA1 transmitted through the line $L_{CLKA1}$ is input to a gate terminal. When the transistors $M_1$ to $M_4$ are driven, the input signals $S_{INA}$ and $S_{INB}$ are converted into the high-frequency signals $S_{A1}$ and $S_{B1}$.

Each of the protection circuits 170a and 170b includes a plurality of diodes that are connected in parallel and are different in a current flowing direction. For example, the protection circuit 170a includes diodes $D_{1a}$ and $D_{2a}$, and the protection circuit 170b includes diodes $D_{1b}$ and $D_{2b}$. The diodes $D_{1a}$ and $D_{2a}$ are connected to the line $L_{CLKA1}$ and the reference potential GND1. The diodes $D_{1b}$ and $D_{2b}$ are connected to the line $L_{CLKB1}$ and the reference potential GND1. When variation of the voltages of the input signals $S_{INA}$ and $S_{INB}$ and the reference potential GND1 becomes equal to or more than a predetermined prescribed value, these diodes are turned on, and move electric charges between the lines $L_{CLKA1}$ and $L_{CLKB1}$ and the reference potential GND1, thereby suppressing potential difference between the lines $L_{CLKA1}$ and $L_{CLKB1}$ and the reference potential GND1 within a range not destroying the internal circuit of the electronic circuit 100.

Note that, in the present embodiment, the lines $L_{CLKA1}$ and $L_{CLKB1}$ are connected through resistors $R_1$ and $R_2$ that are connected in series. The reference potential GND1 is connected between the resistors $R_1$ and $R_2$. As a result, operation points of the lines $L_{CLKA1}$ and $L_{CLKB1}$ are based on the reference potential GND1.

Figure 3:
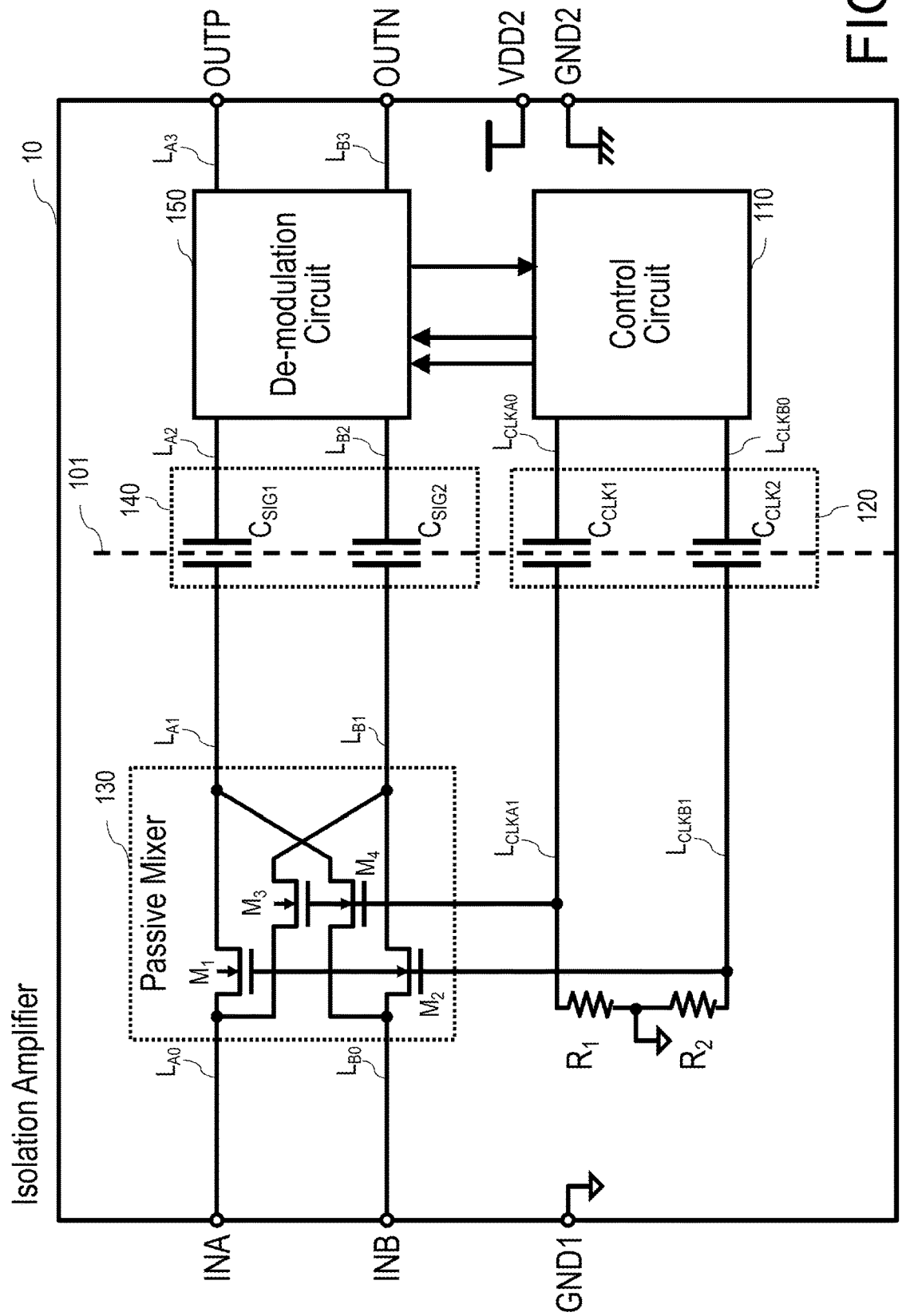
FIG. 3 is a configuration diagram of an electronic circuit 10 according to a comparative example.

The detail of the electronic circuit 100 has been described above. In the following, a case where the voltages of the input signals $S_{INA}$ and $S_{INB}$ and the reference potential GND1 are varied in each of a case where the protection circuits 170a and 170b are provided and a case where the protection circuits 170a and 170b are not provided is described. For description, FIG. 3 illustrates an electronic circuit 10 not including the protection circuits 170a and 170b, as a comparative example of the electronic circuit 100. A configuration of the electronic circuit 10 is the same as the configuration of the electronic circuit 100 except that the electronic circuit 10 does not include the protection circuits 170a and 170b. Therefore, components of the electronic circuit 10 are denoted by the same reference numerals as the components of the electronic circuit 100, and descriptions of such components are omitted.

Figure 4:
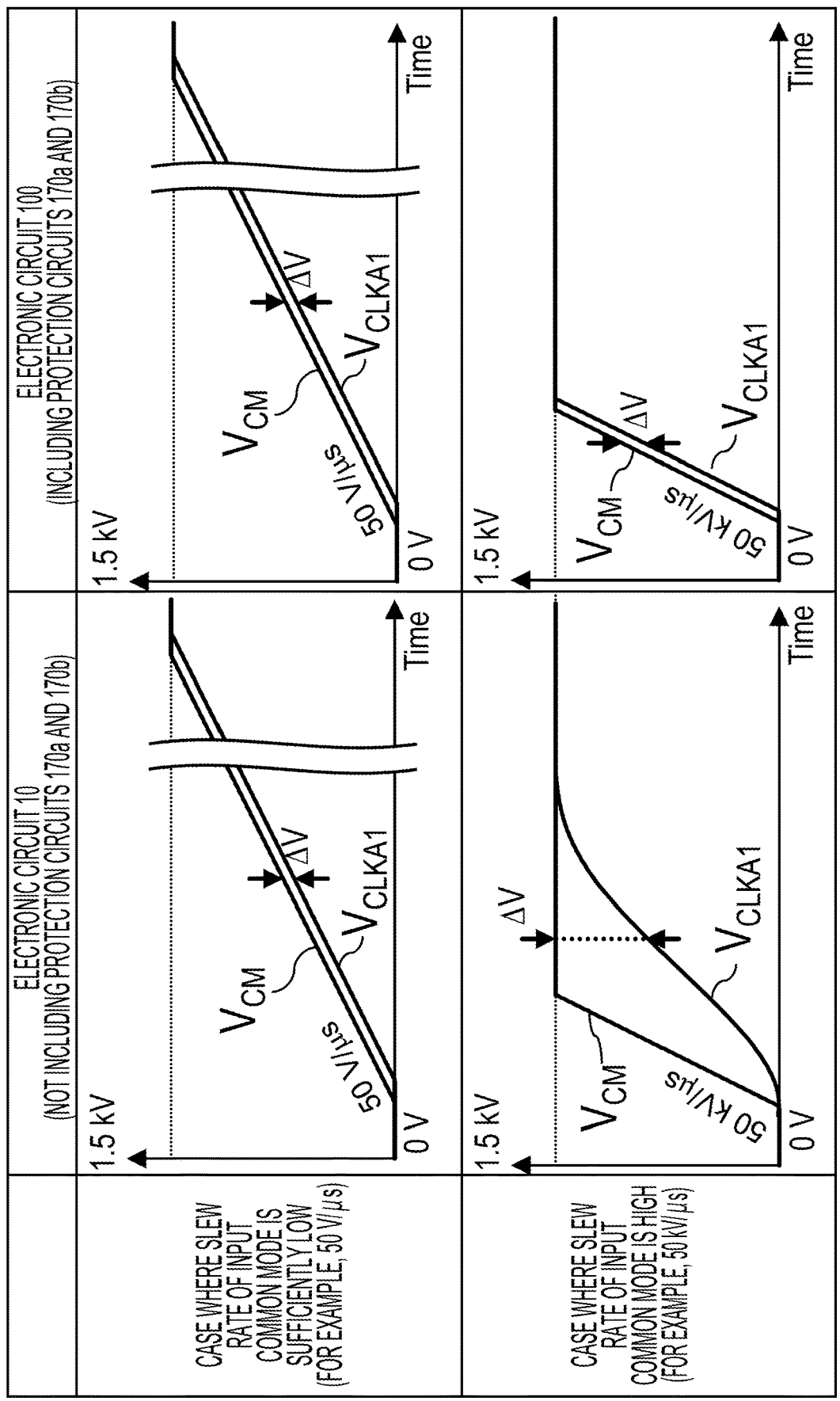
FIG. 4 is a diagram illustrating variation of a potential "$V_{CLKA1}$" based on a slew rate of an input common mode potential "$V_{CM}$" in the electronic circuit 10 and the electronic circuit 100.

FIG. 4 illustrates cases where variation of the voltages of the input signals $S_{INA}$ and $S_{INB}$ and the reference potential GND1 is large and small in each of the electronic circuits 10 and 100. To simplify the description, it is assumed that the input terminals INA and INB and the reference potential GND1 are short-circuited or are connected through a resistor having a sufficiently small resistance value (for example, resistor having resistance value of 1Ω or less), outside each of the electronic circuits 10 and 100. In the following, the potential of the input terminal INA is referred to as a potential "$V_{INA}$", the potential of the input terminal INB is referred to as a potential "$V_{INB}$", a potential of the reference potential GND1 is referred to as a reference potential "$V_{GND1}$", a potential of the line $L_{CLKA1}$ is referred to as a potential "$V_{CLKA1}$", and a potential of the line $L_{CLKB1}$ is referred to as a potential "$V_{CLKB1}$". For description, an intermediate potential of the input terminals INA and INB is referred to as an input common mode potential "$V_{CM}$". In other words, the input common mode potential "$V_{CM}$", the potential "$V_{INA}$", and the potential "$V_{INB}$" have relationship of an expression (1).
[Expression 1]

Further, in this case, the potential difference between each of the input terminals INA and INB and the reference potential GND1 is sufficiently small. This is expressed by an expression (2)
[Expression 2]

The expression (2) represents that, in a case where the potentials "$V_{INA}$" and "$V_{INB}$" and the reference potential "$V_{GND1}$" are varied, the input common mode potential "$V_{CM}$" is also varied. In the following, the case where the input common mode potential "$V_{CM}$" is varied indicates the case where at least any of the potentials "$V_{INA}$" and "$V_{INB}$" and the reference potential "$V_{GND1}$" is varied.

In the present embodiment, as an example, the potential "$V_{CLKA1}$" in the case where the input common mode potential "$V_{CM}$" is varied is described. The line $L_{CLKA1}$ has a capacitance based on a parasitic capacitance of the line $L_{CLKA1}$ itself, and a capacitance of the capacitor $C_{CLK1}$ and an input capacitance of the frequency converter 130 connected to the line $L_{CLKA1}$. Hereinafter, the capacitance is also referred to as a capacitance $C_1$. The line $L_{CLKA1}$ is connected to the reference potential GND1 through the resistor $R_1$. Therefore, in the case where the input common mode potential "$V_{CM}$" is varied, the electric charges move between the capacitance $C_1$ and the reference potential GND1. As a result, in the case where the input common mode potential "$V_{CM}$" is varied, the potential "$V_{CLKA1}$" is also varied following variation of the input common mode potential "$V_{CM}$". Further, since the line $L_{CLKA1}$ and the reference potential GND1 are connected through the resistor $R_1$, a low-pass filter is formed between the line $L_{CLKA1}$ and the reference potential GND1. The low-pass filter limits variation speed of the potential "$V_{CLKA1}$" (hereinafter, variation speed of potential is also referred to as slew rate). At this time, as expressed in an expression (3), a difference between the input common mode potential "$V_{CM}$" and the potential "$V_{CLKA1}$" is defined as a potential difference "$\Delta\Delta V$".
[Expression 3]

As an example of the present embodiment, when the potential difference "$\Delta V$" is 5 V, an upper limit of the variation speed of the potential "$V_{CLKA1}$" is expressed by an expression (4) with the capacitance $C_1$ (capacitance value is also referred to as "$C_1$" and is, for example, 100 fF), the resistor $R_1$ (resistance value is also referred to as "$R_1$" and is, for example, 100 kΩ), and the potential difference "$\Delta V$".
[Expression 4]

In other words, in the present embodiment, in the case where the protection circuit 170a is not provided, the potential "$V_{LCKA1}$" can be varied following the input common mode potential "$V_{CM}$" when the slew rate of the input common mode potential "$V_{CM}$" is up to 500 V/μs. Therefore, as illustrated in an upper part of FIG. 4, in the case where the slew rate of the input common mode potential "$V_{CM}$" is relatively low (for example, 50 V/μs), the potential "$V_{CLKA1}$" in each of the electronic circuits 10 and 100 is varied following the input common mode potential "$V_{CM}$", and the potential difference "$\Delta V$" maintains a certain level.

In contrast, in a case where the slew rate of the input common mode potential "$V_{CM}$" exceeds 500 V/μs, the potential "$V_{CLKA1}$" cannot be varied following variation of the input common mode potential "$V_{CM}$" in the electronic circuit 10. For example, in a case where the slew rate of the input common mode potential "$V_{CM}$" is high (for example, 50 kV/μs) as illustrated in a lower part in FIG. 4, movement of the electric charges between the capacitor $C_1$ and the reference potential GND1 cannot catch up with variation of the input common mode potential "$V_{CM}$", and variation of the potential "$V_{CLKA1}$" is delayed. In this case, the potential difference "$\Delta V$" does not maintain the certain level and is increased, and the internal circuit on the input side of the electronic circuit 100 may be destroyed by the large potential difference "$\Delta V$". For example, the transistors included in the frequency converter 130 may be destroyed. In a case of the circuit receiving supply of power, the electric charges can move through the ESD circuit connected to the power supply, which makes it possible to prevent the internal circuit from being destroyed by the potential difference "$\Delta V$". However, since the input side in the present embodiment does not receive supply of power, the above-described issue occurs. Further, in the present embodiment, the line $L_{CLKA1}$ is connected to the gate terminal of each of the transistors $M_3$ and $M_4$, and the line $L_{CLKB1}$ is connected to the gate terminal of each of the transistors $M_1$ and $M_2$. Movement of the electric charges between the line $L_{CLKA1}$ and the reference potential GND1 through the gate terminals of the transistors $M_1$ to $M_4$ hardly occurs. This causes the above-described issue.

In contrast, in the electronic circuit 100, when the potential difference "$\Delta V$" exceeds a predetermined specific value, the protection circuit 170a is turned on. In the example of FIG. 4, the diode $D_{1a}$ is turned on to charge the electric charges to the capacitance $C_1$. Charge of the electric charges through the diode $D_{1a}$ is less influenced by the low-pass filter of the resistor $R_1$. Therefore, as compared with the case where the charge is performed through the resistor $R_1$, the electric charges can move at high speed. Even in the case where the slew rate of the input common mode potential "$V_{CM}$" is high, the potential "$V_{CLKA1}$" can be varied following variation of the input common mode potential "$V_{CM}$" by virtue of the protection circuit 170a, and the potential difference "$\Delta V$" maintains the certain level. As a result, even in the case where the potentials of the input signals $S_{INA}$ and $S_{INB}$ and the reference potential GND1 are steeply varied, it is possible to protect the internal circuit of the electronic circuit 100. Even in the case where the potentials of the input signals $S_{INA}$ and $S_{INB}$ and the reference potential GND1 are steeply varied, the electronic circuit 100 can output the input signals $S_{INA}$ and $S_{INB}$ as the restoration signals $S_{A3}$ and $S_{B3}$. In other words, the electronic circuit 100 can have high CMTI (Common Mode Transient Immunity) characteristics.

Although, in the example of FIG. 4, the diode $D_{1a}$ is turned on to charge the electric charges to the capacitance $C_1$, in a case where inclination of the input common mode potential "$V_{CM}$" is negative, a diode $D_{2a}$ is turned on to discharge the electric charges from the capacitance $C_1$.

As an example of the present embodiment, the potential "$V_{CLKA1}$" in the case where the input common mode potential "$V_{CM}$" is varied has been described. The same is true of the potential "$V_{CLKB1}$". The line $L_{CLKB1}$ has a capacitance based on a parasitic capacitance of the line $L_{CLKB1}$ itself, and a capacitance of the capacitor $C_{CLK2}$ and an input capacitance of the frequency converter 130 connected to the line $L_{CLKB1}$. In the following, the capacitance is also referred to as a capacitance $C_2$. The line $L_{CLKB1}$ is connected to the reference potential GND1 through the resistor $R_2$. Therefore, in the case where the input common mode potential "$V_{CM}$" is varied, the electric charges move between the capacitance $C_2$ and the reference potential GND1. As a result, in the case where the input common mode potential "$V_{CM}$" is varied, the potential "$V_{CLKB1}$" is also varied following variation of the input common mode potential "$V_{CM}$". Further, since the line $L_{CLKB1}$ and the reference potential GND1 are connected through the resistor $R_2$, a low-pass filter is formed between the line $L_{CLKB1}$ and the reference potential GND1. The low-pass filter limits slew rate of the potential "$V_{CLKB1}$". In a case where the protection circuit 170b is not provided, a potential difference "ΔV2" between the input common mode potential "$V_{CM}$" and the potential "$V_{CLKB1}$" cannot maintain the certain level depending on the slew rate, which causes destruction of the internal circuit of the electronic circuit 100.

In contrast, in the electronic circuit 100, when the potential difference "ΔV2" exceeds a predetermined specific value, the protection circuit 170b is turned on. In the example of FIG. 4, the diode $D_{1b}$ is turned on to charge the electric charges to the capacitor $C_2$. Charge of the electric charges through the diode $D_{1b}$ is less influenced by the low-pass filter of the resistor $R_2$. Therefore, as compared with the case where the charge is performed through the resistor $R_2$, the electric charges can move at high speed. Even in the case where the slew rate of the input common mode potential "$V_{CM}$" is high, the potential "$V_{CLKB1}$" can be varied following variation of the input common mode potential "$V_{CM}$" by virtue of the protection circuit 170b, and the potential difference "ΔV2" maintains the certain level. As a result, even in the case where the potentials of the input signals $S_{INA}$ and $S_{INB}$ and the reference potential GND1 are steeply varied, it is possible to protect the internal circuit of the electronic circuit 100, and the electronic circuit 100 can have high CMTI characteristics.

Although the present embodiment has been described above, modifications can be variously implemented and embodied. For example, in the present embodiment, the restoration signals $S_{A3}$ and $S_{B3}$ output from the buffer circuit 154 are transmitted to the logic circuit 111 as an example. Alternatively, the restoration signals $S_{A3}$ and $S_{B3}$ may be transmitted from the frequency converter 151, the amplifier 152, or the filter circuit 153 to the logic circuit 111. In the following, modifications of the configuration and the operation of the present embodiment are described.

(Modification 1)

Figure 5:
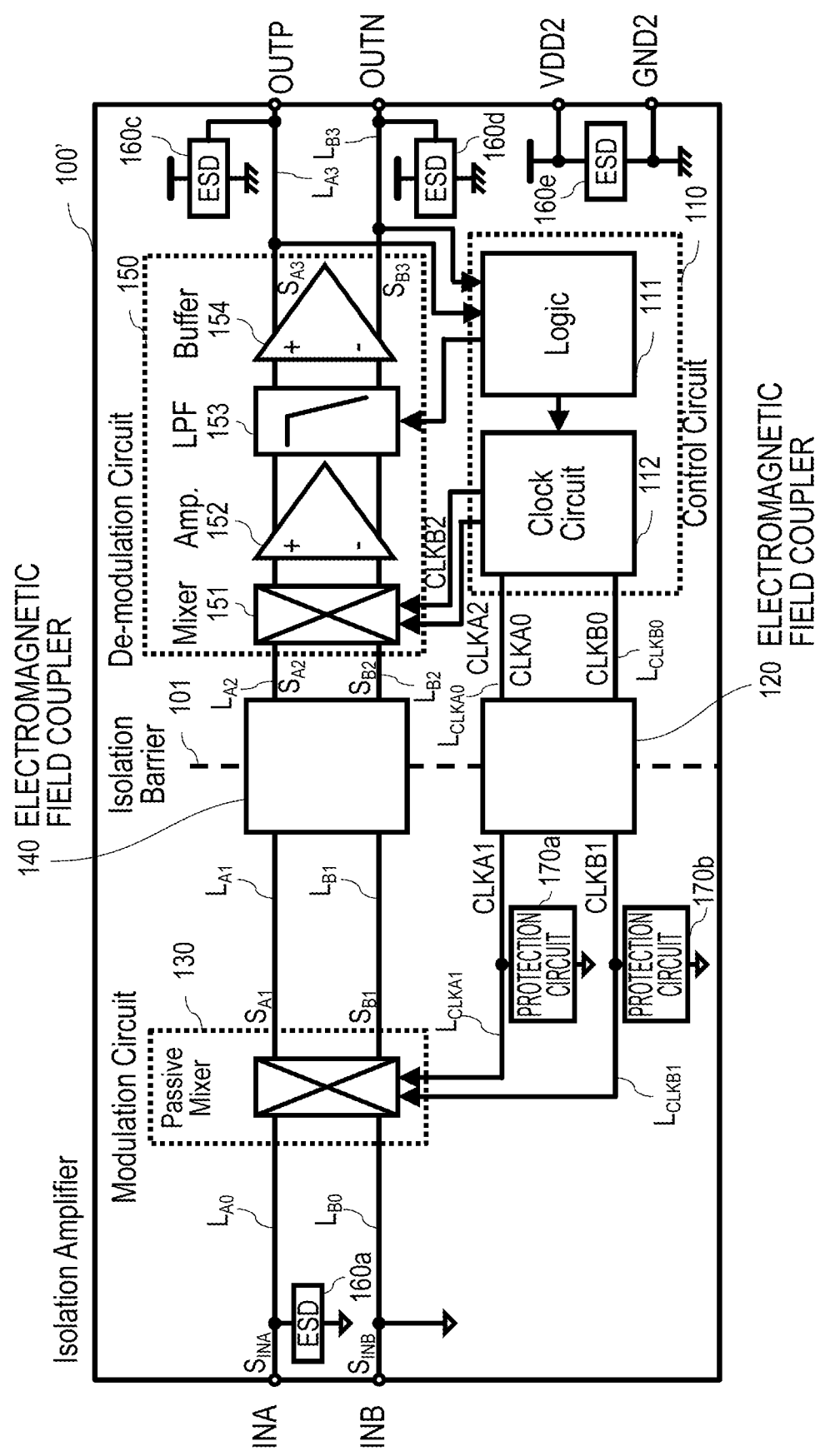
FIG. 5 is a configuration diagram of an electronic circuit 100' applicable to the first embodiment.

FIG. 5 is a configuration diagram of an electronic circuit 100' in which a potential level of the input terminal INB is equivalent to the level of the reference potential GND1. Making the potential level of the input terminal equivalent to the level of the reference potential GND1 allows for omission of the ESD circuit 160b and reduction in the number of terminals on the input side. This makes it possible to reduce the circuit scale, the mounting area, and the cost.

(Modification 2)

Figure 6:
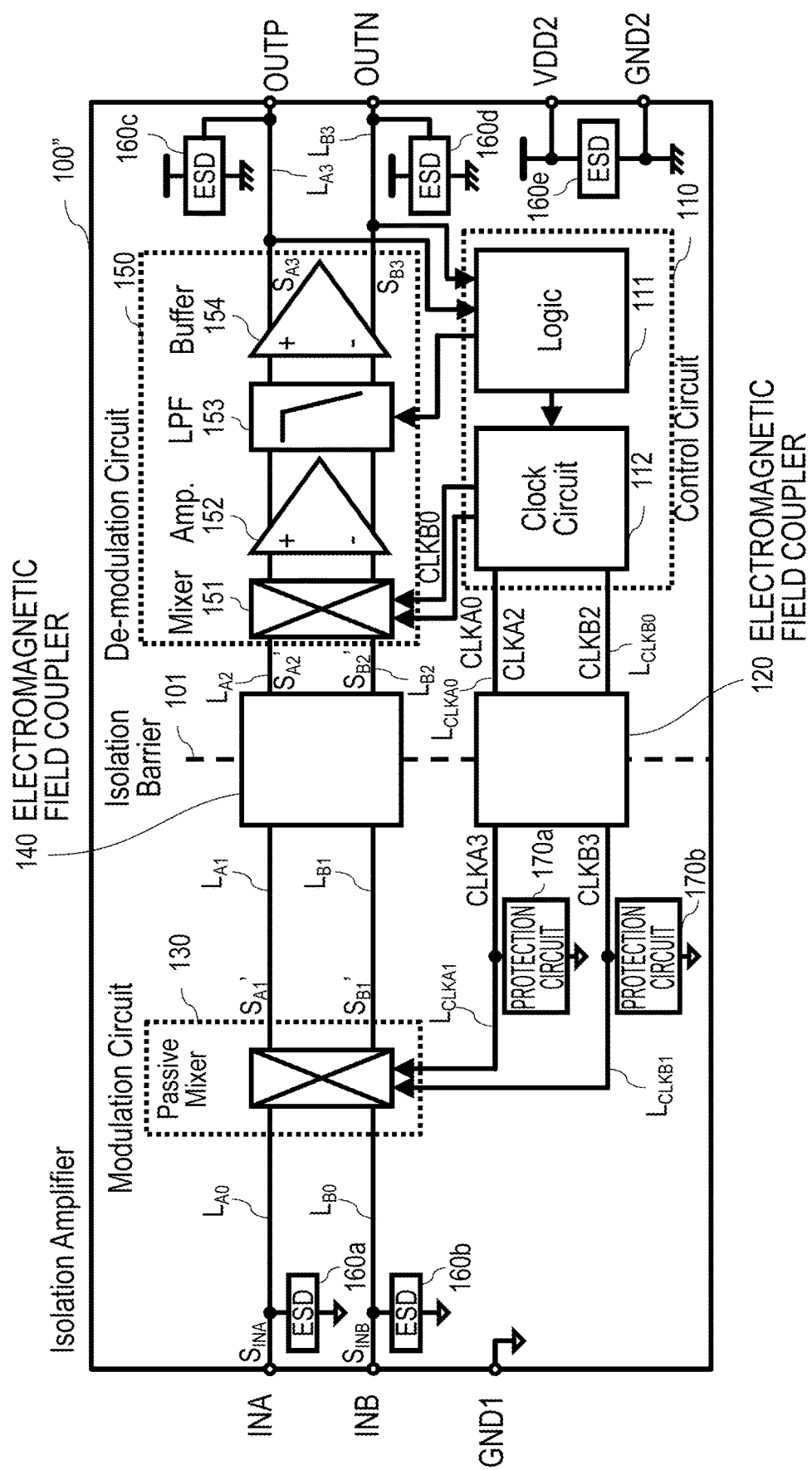
FIG. 6 is a configuration diagram of an electronic circuit 100" applicable to the first embodiment.

FIG. 6 is a configuration diagram of an electronic circuit 100" in which output destinations of the clock signals CLKA0 and CLKB0 output from the clock circuit 112 are exchanged with output destinations of the clock signals CLKA2 and CLKB2. In the present embodiment, the phase shift added to the high-frequency signals $S_{A2}$ and $S_{B2}$ by transmission by the electromagnetic field coupler 140 is corrected by the clock signals CLKA2 and CLKB2. In the present modification, at a stage of conversion into the high-frequency signals by the frequency converter 130, the phase shift added to the high-frequency signals by transmission by the electromagnetic field coupler 140 is corrected.

The clock circuit 112 transmits the clock signals CLKA2 and CLKB2 to the electromagnetic field coupler 120, and transmits the clock signals CLKA0 and CLKB0 to the frequency converter 151. The clock signals CLKA2 and CLKB2 are shifted in phase by transmission by the electromagnetic field coupler 120, and become clock signals CLKA3 and CLKB3. The clock signals CLKA3 and CLKB3 are transmitted to the frequency converter 130. The frequency converter 130 is driven by the clock signals CLKA3 and CLKB3, and converts the input signals $S_{INA}$ and $S_{INB}$ into high-frequency signals $S_{A1}'$ and $S_{B1}'$. The high-frequency signals $S_{A1}'$ and $S_{B1}'$ are shifted in phase by transmission by the electromagnetic field coupler 140, and become high-frequency signals $S_{A2}'$ and $S_{B2}'$. The high-frequency signals $S_{A2}'$ and $S_{B2}'$ are transmitted to the frequency converter 151. The frequency converter 151 converts frequencies of the high-frequency signals $S_{A2}'$ and $S_{B2}'$ into frequencies similar to the frequencies of the input signals $S_{INA}$ and $S_{INB}$ by using the clock signals CLKA0 and CLKB0, and generate the restoration signals $S_{A3}$ and $S_{B3}$. The restoration signals $S_{A3}$ and $S_{B3}$ are output to the output terminal OUTP and the output terminal OUTN through the amplifier 152, the filter circuit 153, and the buffer circuit 154.

When the present embodiment and the present modification are combined, the electromagnetic field coupler 120 transmits one of a set of the clock signals CLKA0 and CLKB0 and a set of the clock signals CLKA2 and CLKB2 by electromagnetic field coupling. The frequency converter 130 is driven by one of a set of the clock signals CLKA1 and CLKB1 that are obtained by shifting the phases of the clock signals CLKA0 and CLKB0, and a set of the clock signals CLKA3 and CLKB3 that are obtained by shifting the phases of the clock signals CLKA2 and CLKB2, and converts a set of the input signals $S_{INA}$ and $S_{INB}$ into a set of the high-frequency signals $S_{A1}$ and $S_{B1}$ or a set of the high-frequency signals $S_{A1}'$ and $S_{B1}'$. The set of the high-frequency signals $S_{A1}$ and $S_{B1}$ or the set of the high-frequency signals $S_{A1}'$ and $S_{B1}'$ is converted into a set of the high-frequency signals $S_{A2}$ and $S_{B2}$ or a set of the high-frequency signals $S_{A2}'$ and $S_{B2}'$ by the electromagnetic field coupler 140. The frequency converter 151 converts the set of the high-frequency signals $S_{A1}$ and $S_{B1}$ or the set of the high-frequency signals $S_{A1}'$ and $S_{B1}'$ into a set of the restoration signals $S_{A3}$ and $S_{B3}$ by using the other of the set of the clock signals CLKA0 and CLKB0 and the set of the clock signals CLKA2 and CLKB2.

As described above, the output destinations of the clock signals CLKA0 and CLKB0 may be exchanged with the output destinations of the clock signals CLKA2 and CLKB2. Based on the characteristics of the phase shift by transmission by the electromagnetic field couplers 120 and 140, the characteristics of the frequency converter 151, the characteristics of the electronic devices installed in the lines $L_{CLKA0}$, $L_{CLKA1}$, $L_{CLKB0}$, and $L_{CLKB1}$, or the like, the clock signals CLKA0 and CLKB0 may be adjusted to clock signals CLKA0' and CLKB0'. In this case, the clock signals CLKA2 and CLKB2 may be adjusted to clock signals CLKA2' and CLKB2'.

(Modification 3)

Figure 7C:
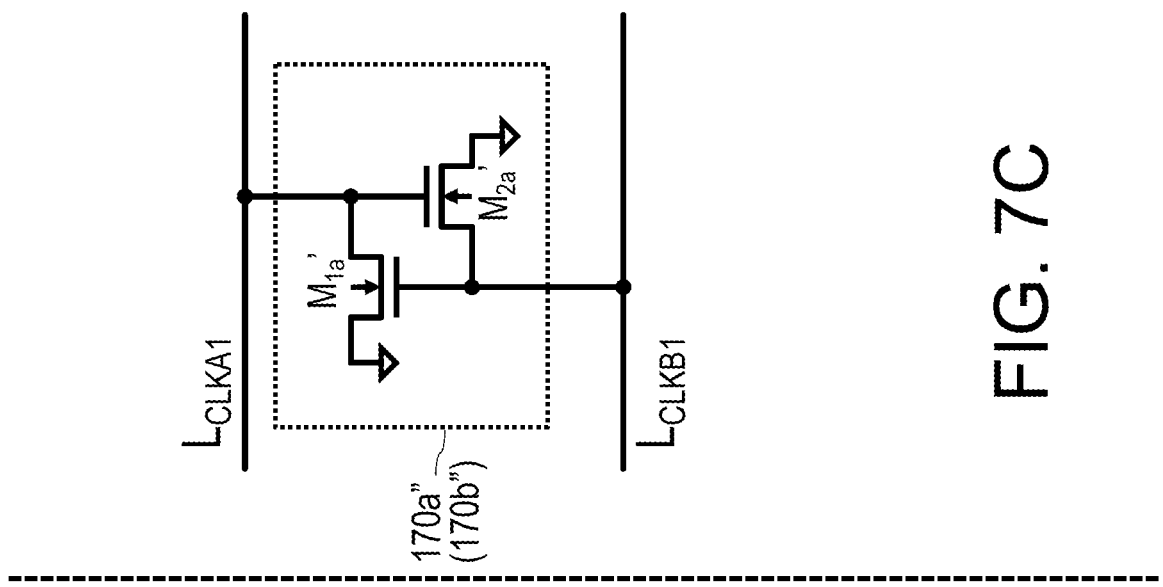
FIGS. 7A to 7C are diagrams illustrating various configurations of protection circuits 170a and 170b.
Figure 7B:
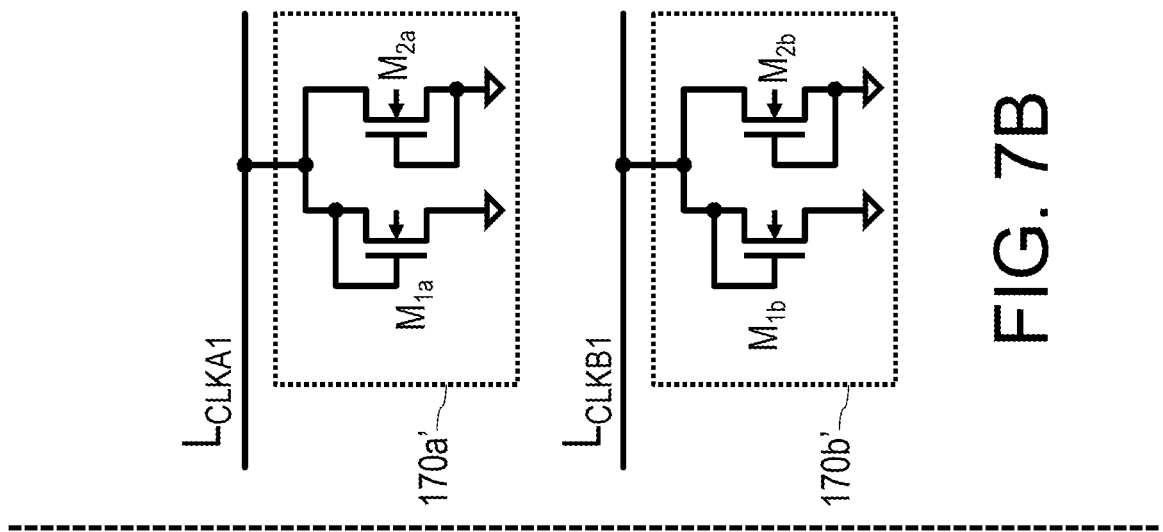
Figure 7A:
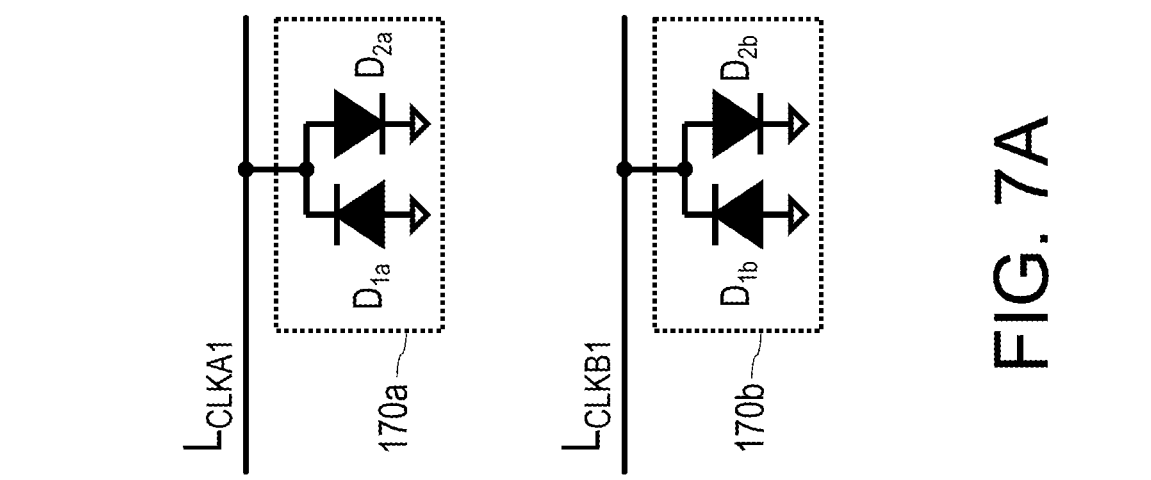

FIGS. 7A to 7C are diagrams illustrating various configurations of the protection circuits 170a and 170b. FIG. 7A illustrates the protection circuits each including the diodes described in the present embodiment. The protection circuit 170a includes the diodes $D_{1a}$ and $D_{2a}$, and the protection circuit 170b includes the diodes $D_{1b}$ and $D_{2b}$.

FIG. 7B is a configuration diagram of protection circuits 170a' and 170b' each using MOS transistors. The protection circuit 170a' includes transistors $M_{1a}$ and $M_{2a}$ that are connected in parallel with the line $L_{CLKA1}$. A gate terminal of the transistor $M_{1a}$ is connected to a drain terminal, and a source terminal is connected to the reference potential GND1. A gate terminal of the transistor $M_{2a}$ is connected to a source terminal, and the source terminal is connected to the reference potential GND1. When the electric charges are discharged, the transistor $M_{1a}$ is turned on and causes a current to flow therethrough. When the electric charges are charged, the transistor $M_{2a}$ is turned on and causes a current to flow therethrough. The protection circuit 170b' includes transistors $M_{1b}$ and $M_{2b}$. The transistor $M_{1b}$ has a configuration similar to the described configuration of the transistor $M_{1a}$, and the transistor $M_{2b}$ has a configuration similar to the described configuration of the transistor $M_{2a}$.

FIG. 7C is a configuration diagram of a protection circuit 170a" (170b") connected to both of the lines $L_{CLKA1}$ and $L_{CLKB1}$. Hereinafter, the circuit is also simply referred to as the protection circuit 170a". The protection circuit 170a" includes transistors $M_{1a}'$ and $M_{2a}'$. A drain terminal of the transistor $M_{1a}'$ is connected to the line $L_{CLKA1}$ and a gate terminal of the transistor $M_{2a}'$. A source terminal of the transistor $M_{1a}'$ and a source terminal of the transistor $M_{2a}'$ are connected to the reference potential GND1. A drain terminal of the transistor $M_{2a}'$ is connected to the line $L_{CLKB1}$ and a gate terminal of the transistor $M_{1a}'$. The electric charges are charged/discharged from the reference potential GND1 to the line $L_{CLKA1}$ through the transistor $M_{1a}'$, and the electric charges are charged/discharged from the reference potential GND1 to the line $L_{CLKB1}$ through the transistor $M_{2a}'$. In the protection circuit 170a", the number of transistors can be reduced as compared with the protection circuits 170a' and 170b'. This makes it possible to reduce the circuit scale and the cost.

(Modification 4)

Figure 8C:
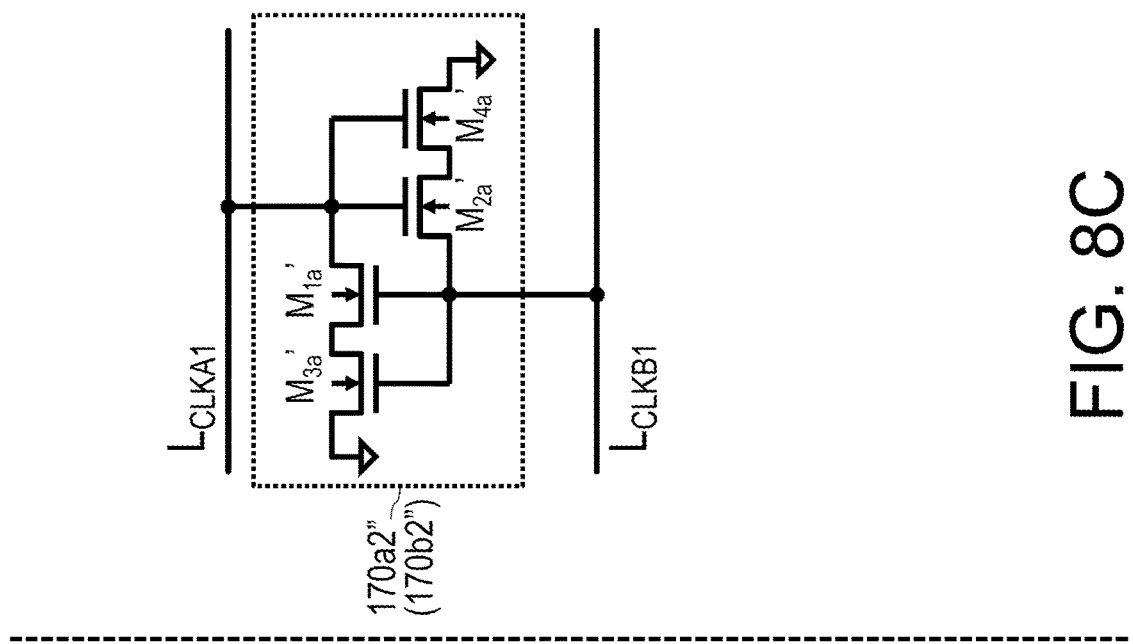
FIGS. 8A to 8C are diagrams each illustrating an example in which the circuits in FIGS. 7A to 7C are connected in multiple stages.
Figure 8B:
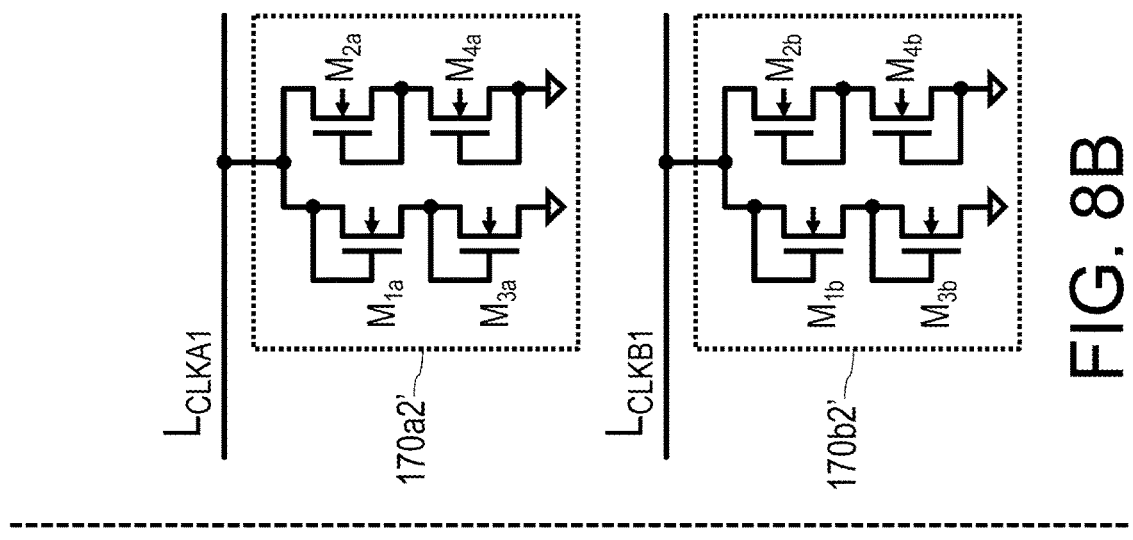
Figure 8A:
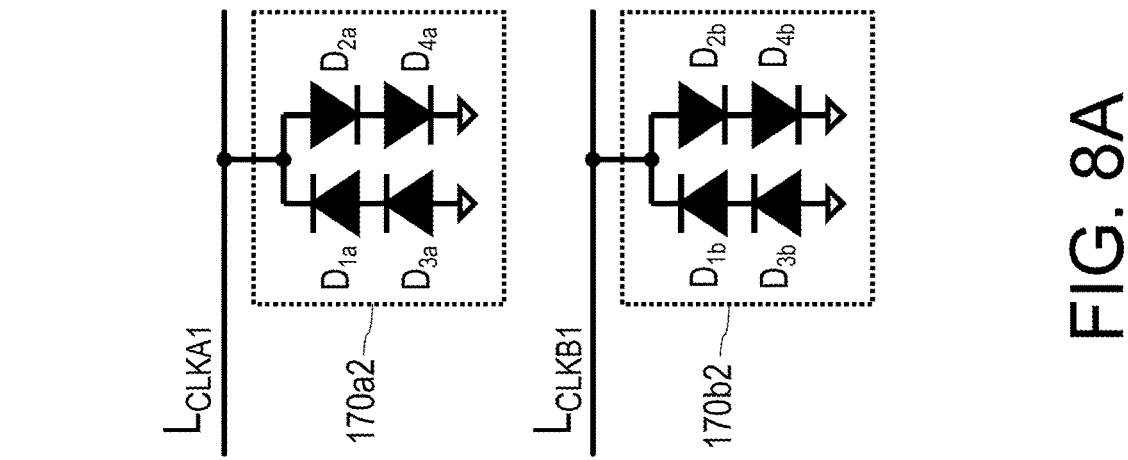

FIGS. 8A to 8C are configuration diagrams each illustrating a protection circuit in which the circuits described in FIGS. 7A to 7C are connected in multiple stages. As an example, a case where the circuits described in FIGS. 7A to 7C are connected in two stages is illustrated in FIGS. 8A to 8C; however, the circuits may be connected in three or more stages.

FIG. 8A is a configuration diagram of protection circuits 170a2 and 170b2 in which the diodes described in the present embodiment are connected in multiple stages. The protection circuit 170a2 further includes diodes $D_{1a}$ and $D_{4a}$ in addition to the protection circuit 170a, and the protection circuit 170b2 further includes diodes $D_{3b}$ and $D_{4b}$ in addition to the protection circuit 170b. The diode $D_{3a}$ is a diode causing the current to flow therethrough in the direction same as the diode $D_{1a}$, and is connected in series with the diode $D_{1a}$. The diode $D_{4a}$ is a diode causing the current to flow therethrough in the direction same as the diode $D_{2a}$, and is connected in series with the diode $D_{2a}$. The diode $D_{3b}$ is a diode causing the current to flow therethrough in the direction same as the diode $D_{1b}$, and is connected in series with the diode $D_{1b}$. The diode $D_{4b}$ is a diode causing the current to flow therethrough in the direction same as the diode $D_{2b}$, and is connected in series with the diode $D_{2b}$.

The predetermined potential differences "ΔV" and "ΔV2" are necessary for operation of the protection circuits 170a2 and 170b2, as with the protection circuits 170a and 170b. Connecting the diodes in the multiple stages allow for optional setting of the potential differences "ΔV" and "ΔV2". As a result, it is possible to reduce influence on the signals flowing through the line $L_{CLKA1}$ and $L_{CLKB1}$.

FIG. 8B is a diagram illustrating protection circuits 170a2' and 170b2' in which the transistors described in FIG. 7B are connected in multiple stages. The protection circuit 170a2' further includes transistors $M_{3a}$ and $M_{4a}$ in addition to the protection circuit 170a', and the protection circuit 170b2' further includes transistors $M_{3b}$ and $M_{4b}$ in addition to the protection circuit 170b'. The transistor $M_{3a}$ is connected in series with the transistor $M_{1a}$ (source terminal of transistor $M_{1a}$ and drain terminal of transistor $M_{3a}$ are connected). A gate terminal of the transistor $M_{3a}$ is connected to the drain terminal of the transistor $M_{3a}$, and a source terminal of the transistor $M_{1a}$ is connected to the reference potential GND1. The transistor $M_{4a}$ is connected in series with the transistor $M_{2a}$ (source terminal of transistor $M_{2a}$ and drain terminal of transistor $M_{4a}$ are connected). A gate terminal of the transistor $M_{4a}$ is connected to a source terminal of the transistor $M_{4a}$, and the source terminal of the transistor $M_{4a}$ is connected to the reference potential GND1. When the electric charges are discharged, the transistors $M_{1a}$ and $M_{3a}$ are turned on and cause the current to flow therethrough. When the electric charges are charged, the transistors $M_{2a}$ and $M_{4a}$ are turned on and cause the current to flow therethrough.

The protection circuit 170b2' has a configuration similar to the described configuration of the protection circuit 170a2'. The transistor $M_{1a}$ corresponds to the transistor $M_{1b}$, the transistor $M_{2a}$ corresponds to the transistor $M_{2b}$, the transistor $M_{3a}$ corresponds to the transistor $M_{3b}$, and the transistor $M_{4a}$ corresponds to the transistor $M_{4b}$.

Also, in the protection circuits 170a2' and 170b2', connecting the transistors in the multiple stages allows for optional setting of the potential differences "ΔV" and "ΔV2", as with the protection circuits 170a2 and 170b2. As a result, it is possible to reduce influence on the signals flowing through the line $L_{CLKA1}$ and $L_{CLKB1}$.

FIG. 8C is a configuration diagram of a protection circuit 170a2" (170b2") in which the transistors described in FIG. 7C are connected in multiple stages. Hereinafter, the circuit is also simply referred to as the protection circuit 170a2". The protection circuit 170a2" further includes transistors $M_{3a}'$ and $M_{4a}'$ in addition to the protection circuit 170a2'. The transistor $M_{3a}'$ is connected in series with the transistor $M_{1a}'$ (source terminal of transistor $M_{1a}'$ and drain terminal of transistor $M_{1a}'$ are connected). A gate terminal of the transistor $M_{3a}'$ is connected to a gate terminal of the transistor $M_{1a}'$ and a drain terminal of the transistor $M_{2a}'$. A source terminal of the transistor $M_{3a}'$ is connected to the reference potential GND1. The transistor $M_{4a}'$ is connected in series with the transistor $M_{2a}'$ (source terminal of transistor $M_{2a}'$ and drain terminal of transistor $M_{4a}'$ are connected). A gate terminal of the transistor $M_{4a}'$ is connected to the gate terminal of the transistor $M_{2a}'$ and the drain terminal of the transistor $M_{1a}'$. A source terminal of the transistor $M_{4a}'$ is connected to the reference potential GND1. The electric charges are charged/discharged from the reference potential GND1 to the line $L_{CLKA1}$ through the transistors $M_{1a}'$ and $M_{3a}'$, and the electric charges are charged/discharged from the reference potential GND1 to the line $L_{CLKB1}$ through the transistors $M_{2a}'$ and $M_{4a}'$.

Also, in the protection circuit 170a2", connecting the transistors in the multiple stages allows for optional setting of the potential differences "ΔV" and "ΔV2", as with the protection circuits 170a2' and 170b2'. As a result, it is possible to reduce influence on the signals flowing through the line $L_{CLKA1}$ and $L_{CLKB1}$. Further, in the protection circuit 170a2", the number of transistors can be reduced as compared with the protection circuits 170a2' and 170b2'. This makes it possible to reduce the circuit scale and the cost.

(Modification 5)

Figure 9:
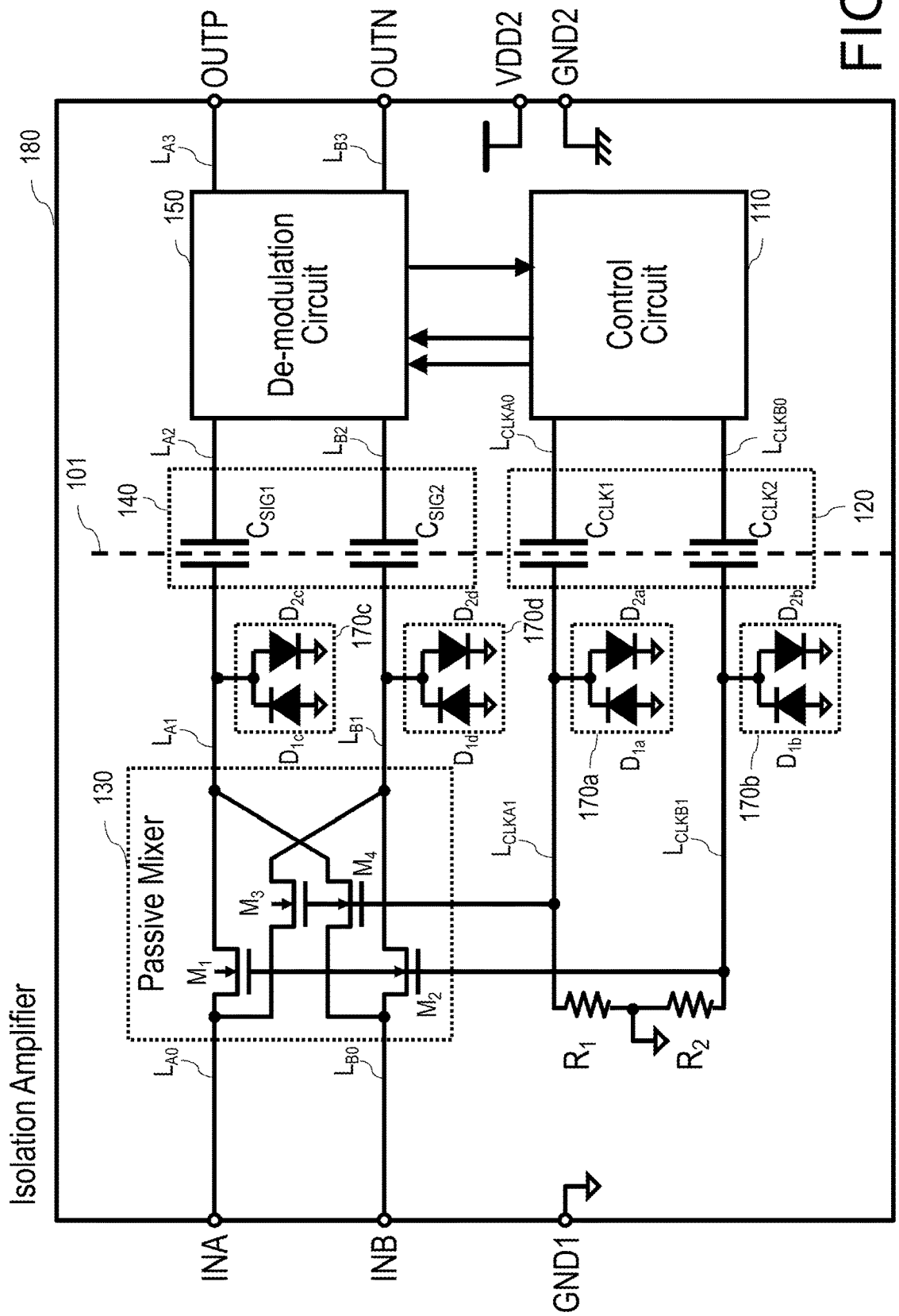
FIG. 9 is a configuration diagram of an electronic circuit 180 applicable to the first embodiment.

FIG. 9 is a configuration diagram of an electronic circuit 180 that further includes protection circuits 170c and 170d between the frequency converter 130 and the electromagnetic field coupler 140 of the electronic circuit 100. The protection circuit 170c is connected to the line $L_{A1}$ and the reference potential GND1, and the protection circuit 170d is connected to the line $L_{B1}$ and the reference potential GND1. The protection circuits 170c and 170d are respectively similar to the protection circuits 170a and 170b in the present embodiment, and various configurations described in the modifications 3 and 4 are applicable to the protection circuits 170c and 170d.

When a potential of the line $L_{A1}$ is defined as a potential "$V_{A1}$", and a potential of the line $L_{B1}$ is defined as a potential "$V_{B1}$", the potentials "$V_{A1}$" and "$V_{B1}$" are also varied following variation of the input common mode potential "$V_{CM}$" as in the present embodiment. First, variation of the potential "$V_{A1}$" is described. The line $L_{A1}$ has a capacitance based on a parasitic capacitance of the line $L_{A1}$ itself, and a capacitance of the capacitor $C_{SIG1}$ and an output capacitance of the frequency converter 130 connected to the line $L_{A1}$. Hereinafter, the capacitance is also referred to as a capacitance $C_3$. By movement of the electric charges between the capacitance $C_3$ and the reference potential GND1, the potential "$V_{A1}$" is varied following variation of the input common mode potential "$V_{CM}$". The line $L_{A1}$ is connected to the transistors $M_1$ and $M_4$, and the electric charges can move through the drain and the source of each of the transistors $M_1$ and $M_4$. In a case where the slew rate of the input common mode potential "$V_{CM}$" is steep, however, movement of the electric charges cannot catch up with variation of the input common mode potential "$V_{CM}$", and a potential difference "ΔV3" between the potential "$V_{A1}$" and the input common mode potential "$V_{CM}$" may not maintain the certain level. Providing the protection circuit 170c that operates when the potential difference "ΔV3" becomes a predetermined value makes it possible to make movement of the electric charges between the line $L_{A1}$ and the reference potential GND1 faster. The potential difference "ΔV3" can be maintained at the certain level and the circuits of the transistors $M_1$ and $M_4$, the capacitor $C_{SIG1}$, and the like connected to the line $L_{A1}$ can be protected by the protection circuit 170c. As a result, the electronic circuit 100 can have higher CMTI characteristics.

Variation of the potential "$V_{B1}$" is similar to the variation of the potential "$V_{A1}$". The line $L_{B1}$ has a capacitance based on a parasitic capacitance of the line $L_{B1}$ itself and a capacitance of the capacitor $C_{SIG2}$ and an output capacitance of the frequency converter 130 connected to the line $L_{B1}$. Hereinafter, the capacitance is also referred to as a capacitance $C_4$. By movement of the electric charges between the capacitance $C_4$ and the reference potential GND1, the potential "$V_{B1}$" is varied following variation of the input common mode potential "$V_{CM}$". The line $L_{B1}$ is connected to the transistors $M_2$ and $M_3$, and the electric charges can move through the drain and the source of each of the transistors $M_2$ and $M_3$. In a case where the slew rate of the input common mode potential "$V_{CM}$" is steep, however, movement of the electric charges cannot catch up with variation of the input common mode potential "$V_{CM}$", and a potential difference "ΔV4" between the potential "$V_{B1}$" and the input common mode potential "$V_{CM}$" may not maintain the certain level. Providing the protection circuit 170d that operates when the potential difference "ΔV4" becomes a predetermined value makes it possible to make movement of the electric charges between the line $L_{B1}$ and the reference potential GND1 faster. The potential difference "ΔV4" can be maintained at the certain level and the circuits of the transistors $M_2$ and $M_3$, the capacitor $C_{SIG2}$, and the like connected to the line $L_{B1}$ can be protected by the protection circuit 170d. As a result, the electronic circuit 100 can have higher CMTI characteristics.

(Modification 6)

Figure 10:
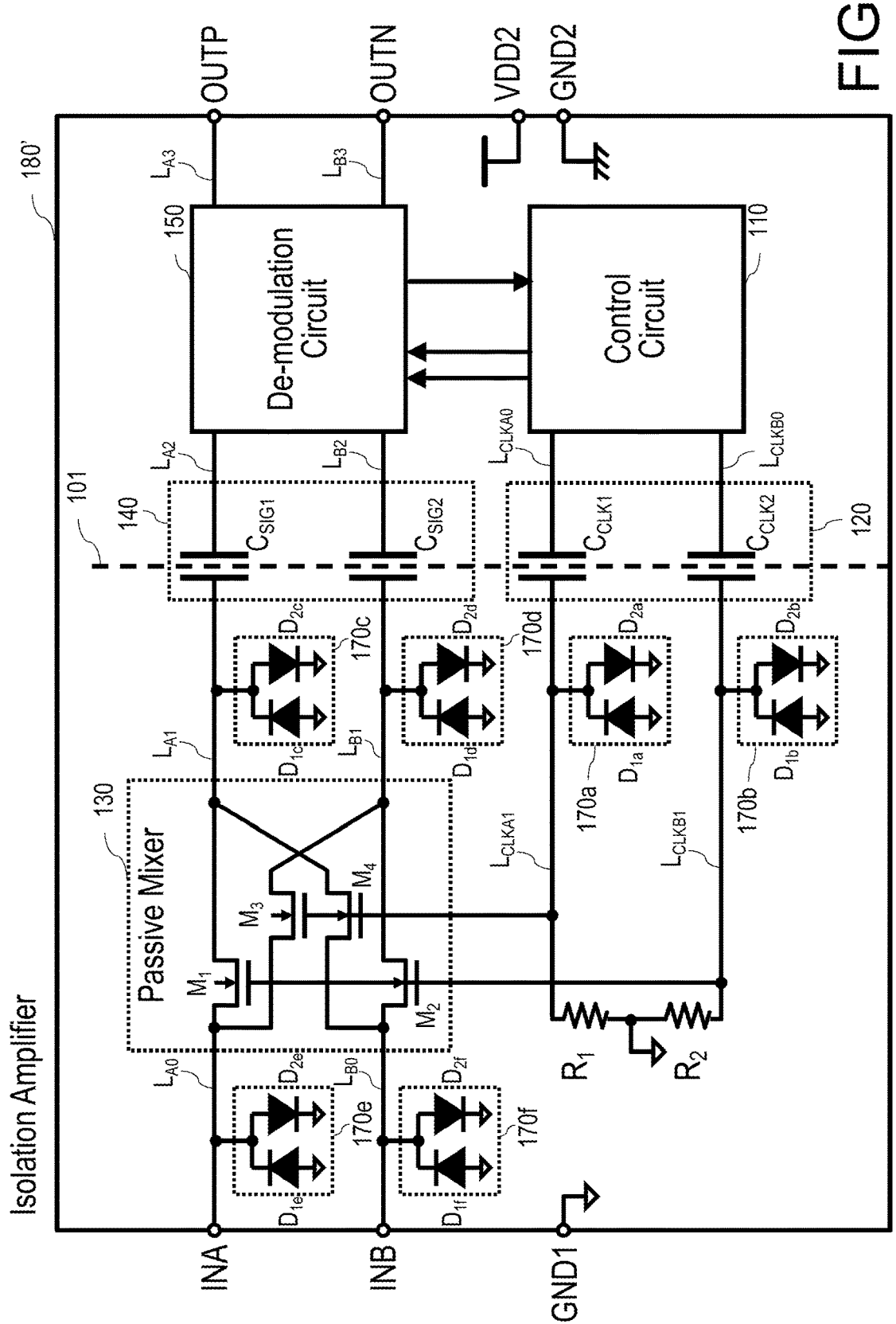
FIG. 10 is a configuration diagram of an electronic circuit 180' applicable to the first embodiment.

FIG. 10 is a configuration diagram of an electronic circuit 180' that further includes a protection circuit 170e between the input terminal INA and the frequency converter 130 of the electronic circuit 180, and further includes a protection circuit 170f between the input terminal INB and the frequency converter 130 of the electronic circuit 180. The protection circuit 170e is connected to the line $L_{A0}$ and the reference potential GND1, and the protection circuit 170f is connected to the line $L_{B0}$ and the reference potential GND1. The protection circuits 170e and 170f are similar to the protection circuits 170a and 170b according to the present embodiment, and various configurations described in the modifications 3 and 4 are also applicable to the protection circuits 170e and 170f.

When a potential of the line $L_{A0}$ is defined as a potential "$V_{A0}$", and a potential of the line $L_{B0}$ is defined as a potential "$V_{B0}$", the potentials "$V_{A0}$" and "$V_{B0}$" are also varied following variation of the input common mode potential "$V_{CM}$" as in the present embodiment. First, variation of the potential "$V_{A0}$" is described. The line $L_{A0}$ has a capacitance based on a parasitic capacitance of the line $L_{A0}$ itself, and a capacitance of the input terminal INA and an input capacitance of the frequency converter 130 connected to the line $L_{A0}$. Hereinafter, the capacitance is also referred to as a capacitance $C_5$. By movement of the electric charges between the capacitance $C_5$ and the reference potential GND1, the potential "$V_{A0}$" is varied following variation of the input common mode potential "$V_{CM}$". In the line $L_{A0}$, the electric charges can move through the input terminal INA and the ESD circuit 160a. In a case where the slew rate of the input common mode potential "$V_{CM}$" is steep, however, movement of the electric charges cannot catch up with variation of the input common mode potential "$V_{CM}$", and a potential difference "ΔV5" between the potential "$V_{A0}$" and the input common mode potential "$V_{CM}$" may not maintain the certain level. Providing the protection circuit 170e that operates when the potential difference "ΔV5" becomes a predetermined value makes it possible to make movement of the electric charges between the line $L_{A0}$ and the reference potential GND1 faster. The potential difference "ΔV5" can be maintained at the certain level and the circuits of the input terminal INA, the transistors $M_1$ and $M_3$, and the like connected to the line $L_{A0}$ can be protected by the protection circuit 170e. As a result, the electronic circuit 100 can have higher CMTI characteristics.

Variation of the potential "$V_{B0}$" is similar to the variation of the potential "$V_{A0}$". The line $L_{B0}$ has a capacitance based on a parasitic capacitance of the line $L_{B0}$ itself and a capacitance of the input terminal INB and an input capacitance of the frequency converter 130 connected to the line $L_{B0}$. Hereinafter, the capacitance is also referred to as a capacitance $C_6$. By movement of the electric charges between the capacitance $C_6$ and the reference potential GND1, the potential "$V_{B0}$" is varied following variation of the input common mode potential "$V_{CM}$". In the line $L_{B0}$, the electric charges can move through the input terminal INB and the ESD circuit 160b. In a case where the slew rate of the input common mode potential "$V_{CM}$" is steep, however, movement of the electric charges cannot catch up with variation of the input common mode potential "$V_{CM}$", and a potential difference "$\Delta V6$" between the potential "$V_{B0}$" and the input common mode potential "$V_{CM}$" may not maintain the certain level. Providing the protection circuit 170f that operates when the potential difference "$\Delta V6$" becomes a predetermined value makes it possible to make movement of the electric charges between the line $L_{B0}$ and the reference potential GND1 faster. The potential difference "$\Delta V6$" can be maintained at the certain level and the circuits of the input terminal INB, the transistors $M_2$ and $M_4$, and the like connected to the line $L_{B0}$ can be protected by the protection circuit 170f. As a result, the electronic circuit 100 can have higher CMTI characteristics.

(Modification 7)

Figure 11:
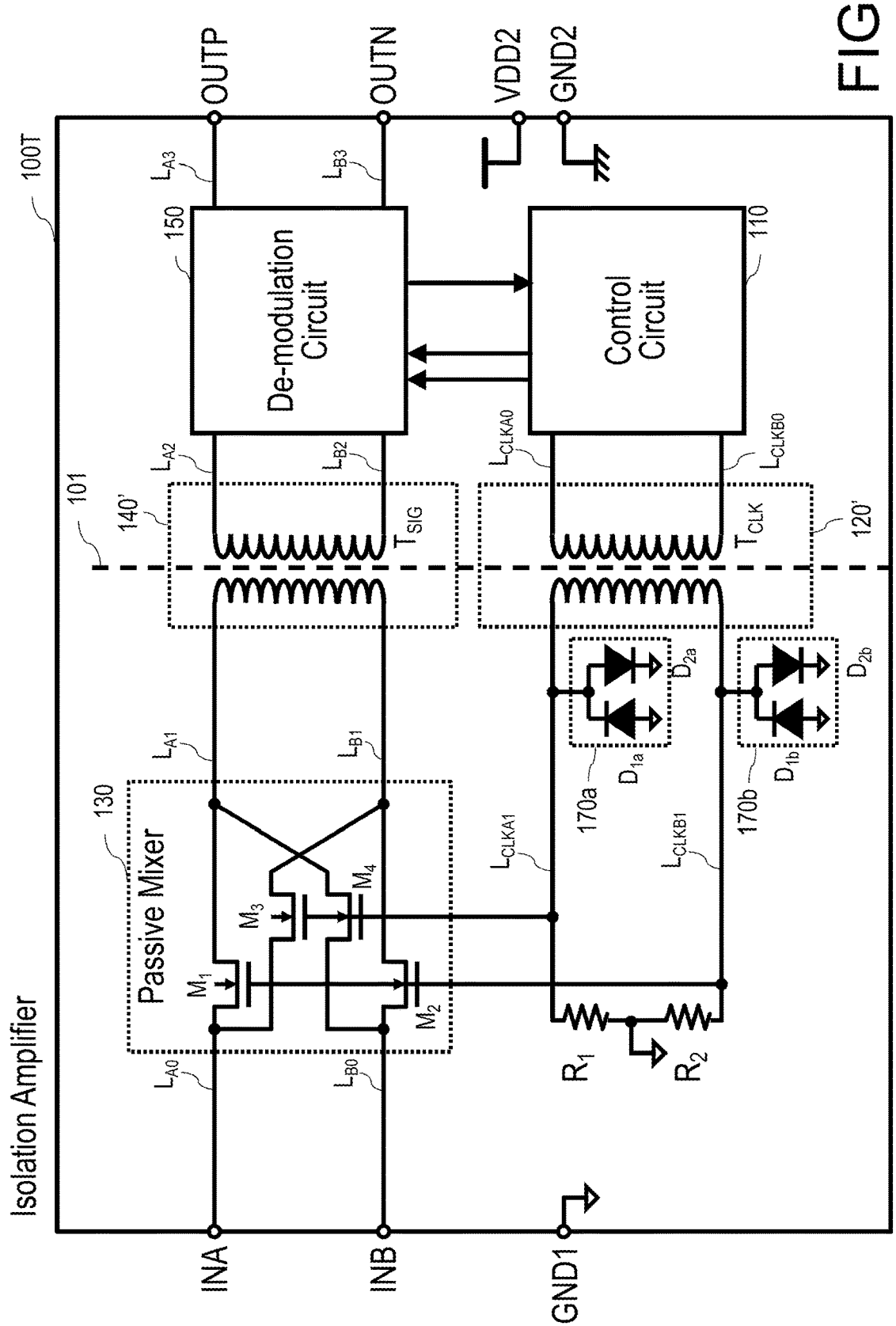
FIG. 11 is a configuration diagram of an electronic circuit 100T applicable to the first embodiment.

FIG. 11 is a configuration diagram of an electronic circuit 100T in which the capacitors of the electromagnetic field couplers 120 and 140 are replaced with transformers. An electromagnetic field coupler 120' includes a transformer $T_{CLK}$, and an electromagnetic field coupler 140' includes a transformer $T_{SIG}$. The transformer $T_{CLK}$ includes paired coils performing electromagnetic field coupling, and the isolation barrier 101 is positioned between the coils. The transformer $T_{SIG}$ includes paired coils performing electromagnetic field coupling, and the isolation barrier 101 is positioned between the coils. This makes it possible to improve an SN ratio of each of the restoration signals. Further, the electromagnetic field couplers 120 and 140 may include a combination of a capacitor and a transformer.

The modifications of the electronic circuit 100 have been described above. These modifications can be used in combination. The electronic circuit 100 can be variously arranged on a chip. Arrangement examples are described below.

Arrangement Example 1

Figure 12:
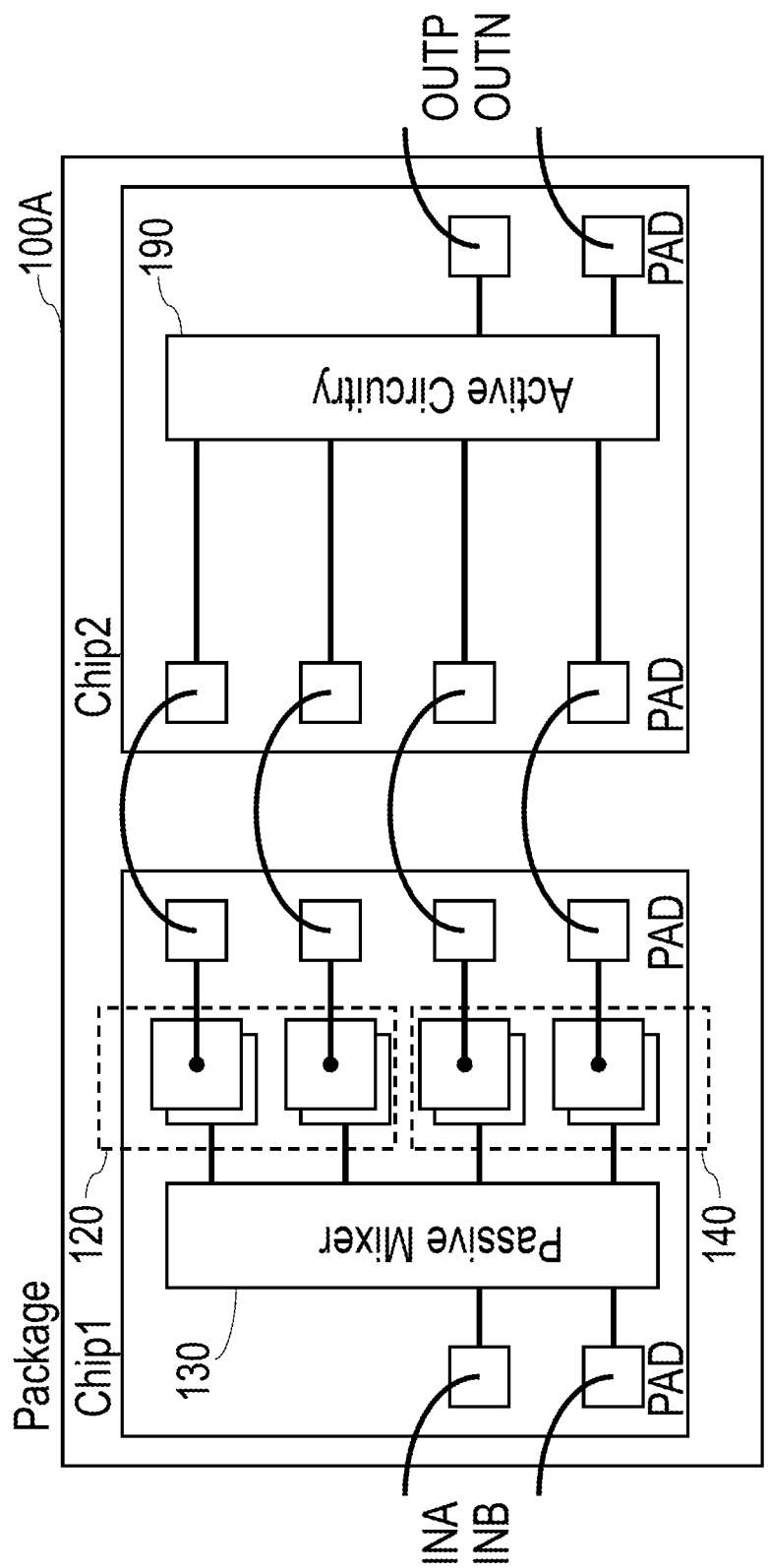
FIG. 12 is a configuration diagram of an electronic circuit 100A applicable to the first embodiment.

FIG. 12 is a configuration diagram of an electronic circuit 100A in which the electromagnetic field couplers 120 and 140 and the frequency converter 130 are arranged on one chip, and the other devices are arranged on a different chip. The electromagnetic field couplers 120 and 140 and the frequency converter 130 (illustrated as Passive Mixer in drawing) are arranged on Chip1. A circuitry 190 (illustrated as Active Circuitry in drawing) is arranged on Chip2. The circuitry 190 includes at least the frequency converter 151, and includes components arranged on the output side among the components of the electronic circuit 100. For example, the circuitry 190 includes the control circuit 110 and the de-modulation circuit 150. Hereinafter, a part of the circuitry 190 may be arranged on a further different chip.

Arrangement Example 2

Figure 13:
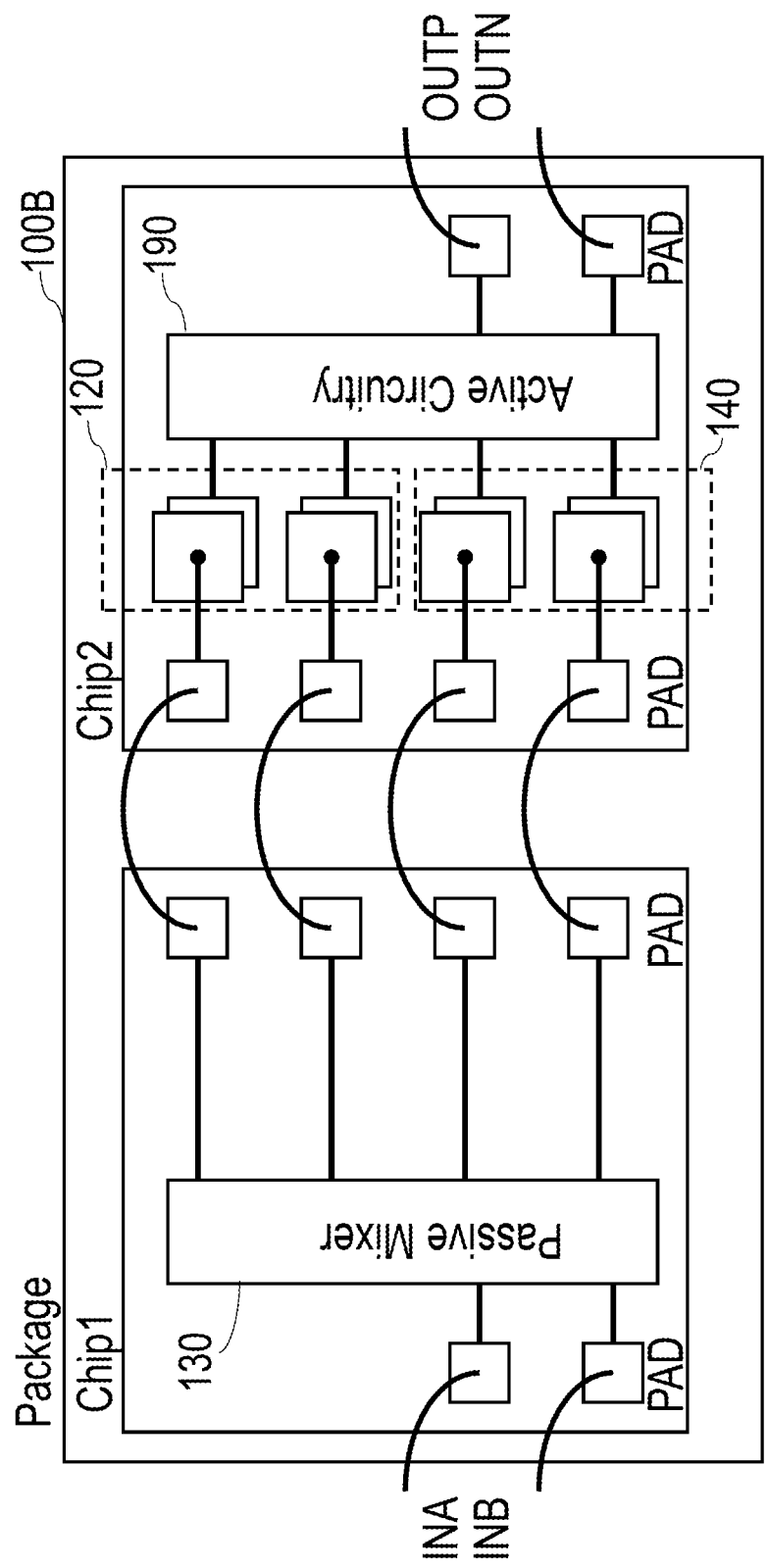
FIG. 13 is a configuration diagram of an electronic circuit 100B applicable to the first embodiment.

FIG. 13 is a configuration diagram of an electronic circuit 100B in which the electromagnetic field couplers 120 and 140 and the frequency converter 151 are arranged on one chip, and the frequency converter 130 is arranged on a different chip. The frequency converter 130 is arranged on Chip1. The electromagnetic field couplers 120 and 140 and the circuitry 190 are arranged on Chip2.

Arrangement Example 3

Figure 14:
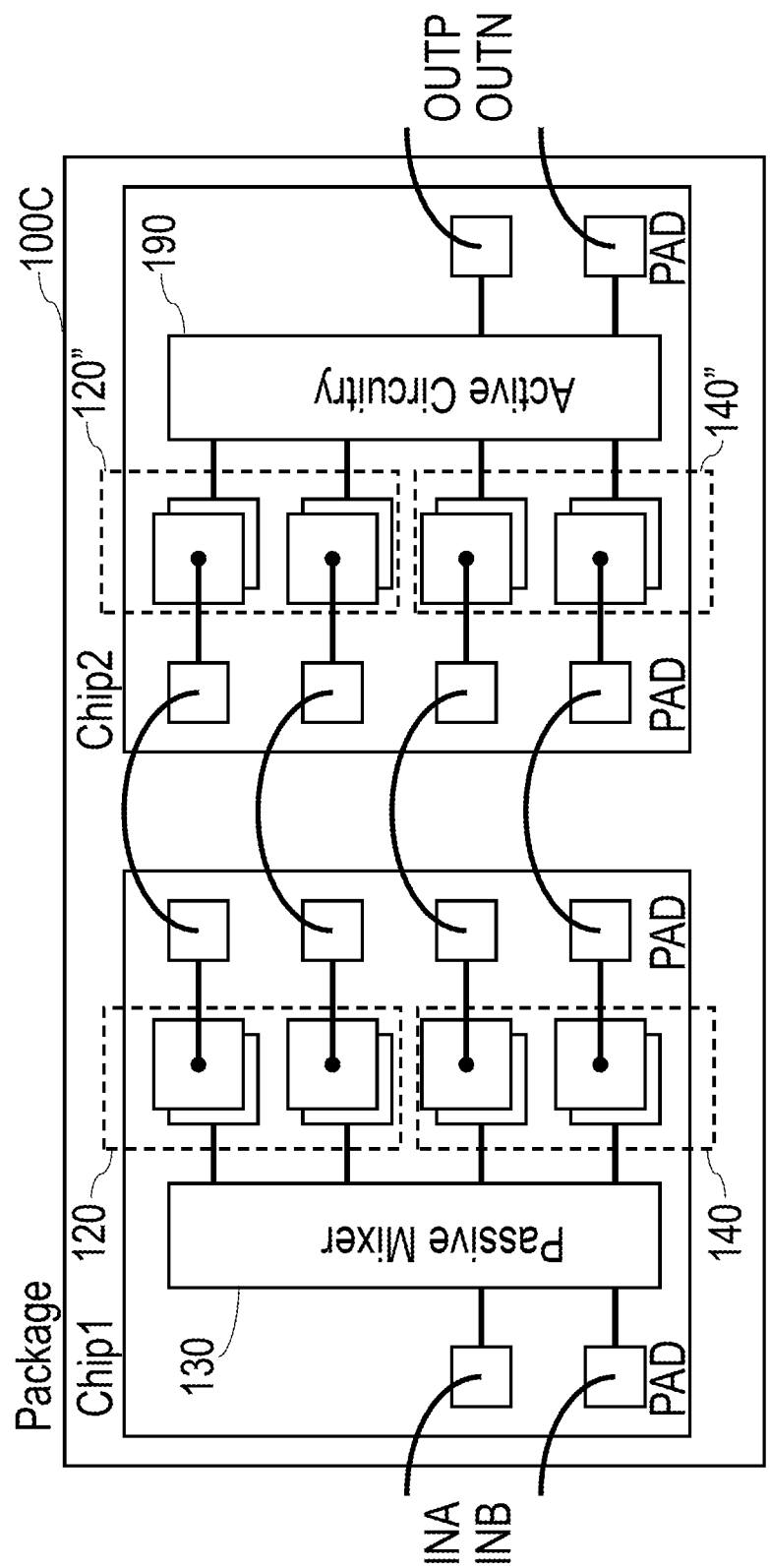
FIG. 14 is a configuration diagram of an electronic circuit 100C applicable to the first embodiment.

FIG. 14 is a configuration diagram of an electronic circuit 100C that further includes an electromagnetic field coupler 120" connected in series with the electromagnetic field coupler 120, and an electromagnetic field coupler 140" connected in series with the electromagnetic field coupler 140. The electromagnetic field couplers 120" and 140" may be respectively similar to the electromagnetic field couplers 120 and 140 according to the present embodiment, or the electromagnetic field couplers 120' and 140' may be applied. The electromagnetic field couplers 120 and 140 and the frequency converter 130 are arranged on Chip1. The electromagnetic field couplers 120" and 140" and the circuitry 190 are arranged on Chip2. The electromagnetic field couplers are connected in series in two stages, which makes it possible to further enhance isolation property between the input terminals INA and INB and the output terminals OUTP and OUTN of the electronic circuit 100. Further, even if the electromagnetic field couplers on one of the chips may be broken down, the isolation property of a certain level or more can be maintained by the electromagnetic field couples on the other chip, which improves safety. The electromagnetic field couplers 120 and 140 may be connected in three or more stages.

Arrangement Example 4

Figure 15:
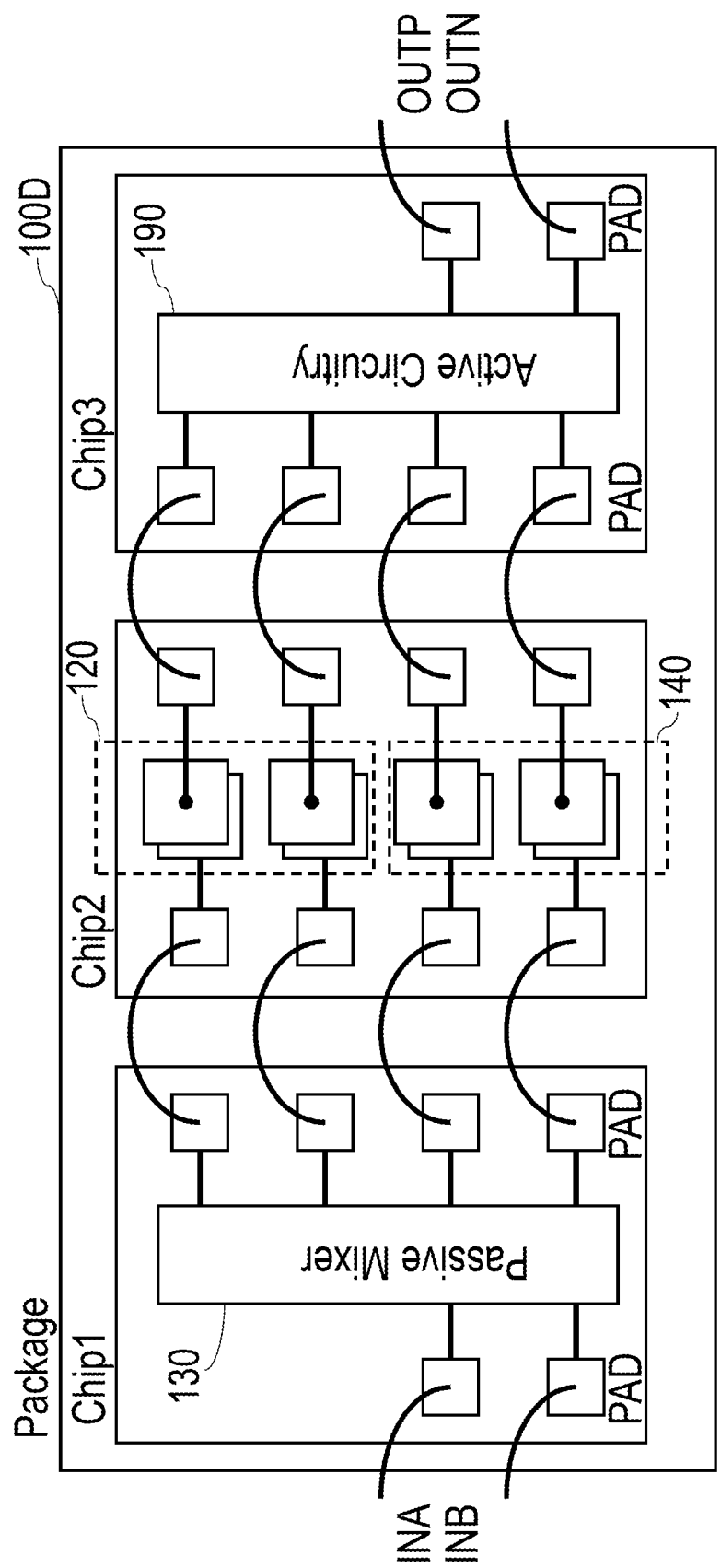
FIG. 15 is a configuration diagram of an electronic circuit 100D applicable to the first embodiment.

FIG. 15 is a configuration diagram of an electronic circuit 100D in which the electromagnetic field couplers 120 and 140 are arranged on a further different chip. The frequency converter 130 is arranged on Chip1. The electromagnetic field couplers 120 and 140 are arranged on Chip2. The circuitry 190 is arranged on Chip3. The electromagnetic field couplers 120 and 140 are arranged on the chip different from the chips for the frequency converter 130 and the circuitry 190, which enables Chip2 on which the electromagnetic field couplers 120 and 140 are arranged to be manufactured by a process different from a process for Chip1 and Chip3. As a result, Chip2 can be manufactured by a process high in withstand voltage performance, and the isolation property between the input terminals INA and INB and the output terminals OUTP and OUTN of the electronic circuit 100D can be further enhanced.

The present embodiment, and the modification examples and the arrangement examples thereof have been described above. The electronic circuit according to the present embodiment includes the protection circuits 170a and 170b between the frequency converter 130 not receiving supply of power and the electromagnetic field coupler 120 transmitting the clock signals through the electromagnetic field coupling. Even in a case where the potentials "$V_{INA}$" and "$V_{INB}$" of the input signals and the reference potential "$V_{GND1}$" are steeply varied, the protection circuits 170a and 170b can protect the internal circuit of the electronic circuit 100 from destruction caused by potential difference. As a result, the electronic circuit 100 can have high CMTI characteristics.

Second Embodiment

Figure 16:
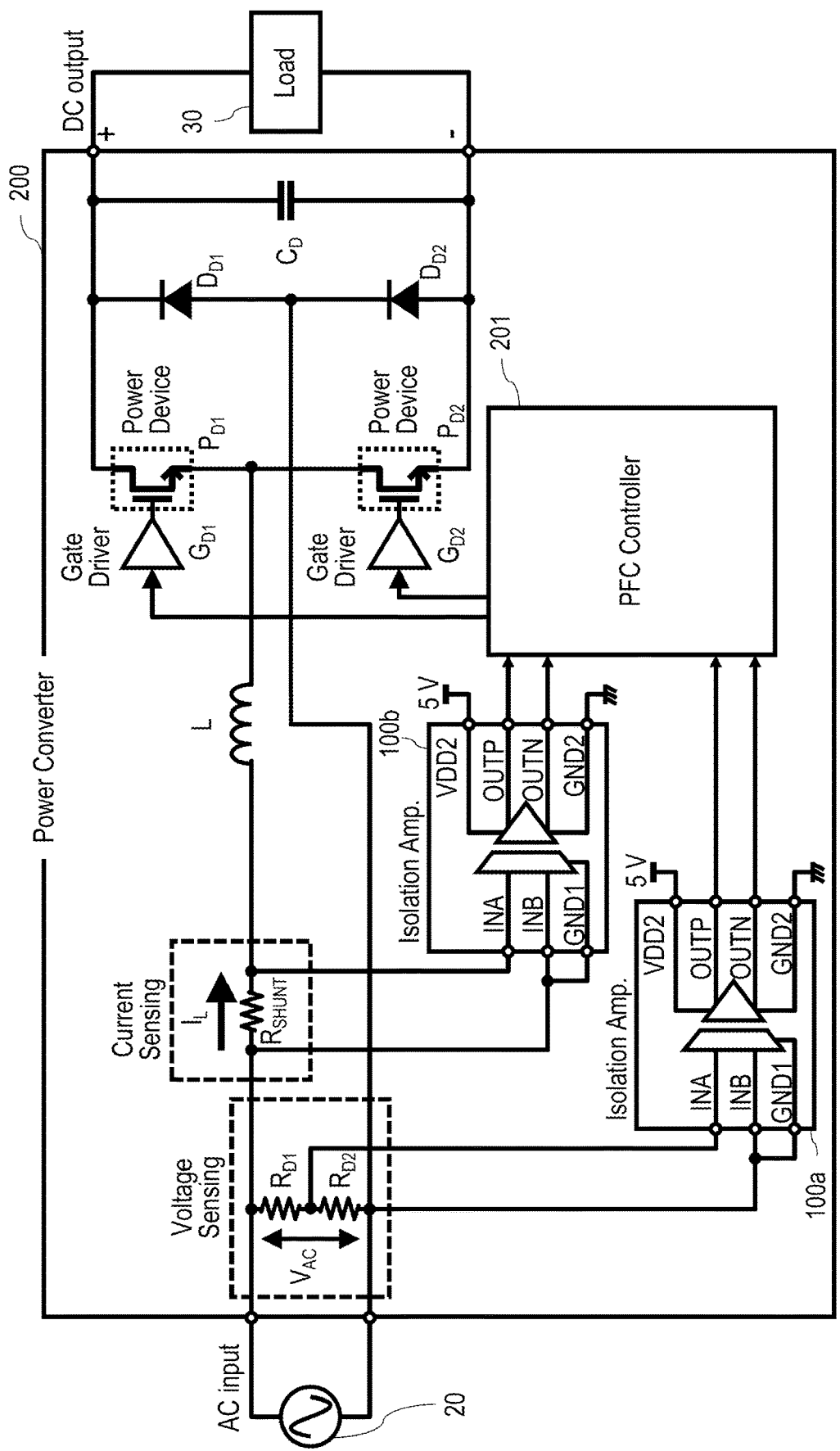
FIG. 16 is a configuration diagram of a power converter 200 according to a second embodiment.

In a second embodiment, an application example using the electronic circuit 100 described in the first embodiment is described. FIG. 16 is a configuration diagram of a power converter 200 (illustrated as Power Converter in drawing) using the electronic circuit 100. The power converter 200 converts power input from an alternating-current power supply 20 into direct-current power, and outputs the direct-current power to a load 30 (illustrated as Load in drawing). The power converter 200 includes electronic circuits 100$a$ and 100$b$, a controller 201 (illustrated as PFC Controller in drawing), resistors $R_{D1}$, $R_{D2}$, and $R_{SHUNT}$, an inductor L, gate drivers $G_{D1}$ and $G_{D2}$ (illustrated as Gate Drivers in drawing), switching devices $P_{D1}$ and $P_{D2}$ (illustrated as Power Devices in drawing), diodes $D_{D1}$ and $D_{D2}$, and a capacitor $C_D$.

The electronic circuits 100$a$ and 100$b$ are each similar to the electronic circuit 100 described in the first embodiment. The input terminal INA of the electronic circuit 100$a$ is connected to one end of the resistor $R_{SHUNT}$, and the input terminal INB of the electronic circuit 100$a$ is connected to the other end of the resistor $R_{SHUNT}$. The resistor $R_{SHUNT}$ converts the input current to the power converter 200 into a voltage. A voltage at the one end of the resistor $R_{SHUNT}$ is input as the input signal $S_{INA}$ of the electronic circuit 100$a$, and a voltage at the other end of the resistor $R_{SHUNT}$ is input as the input signal $S_{INB}$ of the electronic circuit 100$a$. The electronic circuit 100$a$ operates as a current measurement device measuring the input current of the power converter 200. The electronic circuit 100$a$ finally transmits signals representing the input current (illustrated as "$I_c$" in drawing) of the power converter 200, as the restoration signals $S_{A3}$ and $S_{B3}$ to the controller 201.

The input terminal INA of the electronic circuit 100$b$ is connected between the resistors $R_{D1}$ and $R_{D2}$, and the input terminal INB of the electronic circuit 100$b$ is connected to an end of the resistor $R_{D2}$ opposite to an end connected to the resistor $R_{D1}$. The resistors $R_{D1}$ and $R_{D2}$ divide the input voltage to the power converter 200. A voltage at the end of the resistor $R_{D2}$ connected to the resistor $R_{D1}$ is input as the input signal $S_{INA}$ of the electronic circuit 100$b$, and a voltage at the other end of the resistor $R_{D2}$ is input as the input signal $S_{INB}$ of the electronic circuit 100$b$. The electronic circuit 100$b$ operates as a voltage measurement device measuring the input voltage of the power converter 200. The electronic circuit 100$b$ finally transmits signals representing the input voltage of the power converter 200, as the restoration signals $S_{A3}$ and $S_{B3}$ to the controller 201. In FIG. 16, a voltage difference between two ends of the alternating-current power supply is illustrated as "$V_{AC}$".

The controller 201 determines a current that is supplied from the gate driver $G_{D1}$ to the switching device $P_{D1}$ and a current that is supplied from the gate driver $G_{D2}$ to the switching device $P_{D2}$, by using the signals representing the input current of the power converter 200 transmitted from the electronic circuit 100$a$ and the signals representing the input voltage of the power converter 200 transmitted from the electronic circuit 100$b$. The controller 201 instructs the gate drivers $G_{D1}$ and $G_{D2}$ to supply the respective determined currents. In the present embodiment, as an example, the controller 201 is a PFC (Power Factor Collection) Controller; however, an optional processing IC is applicable.

The gate driver $G_{D1}$ supplies the current to the switching device $P_{D1}$ in response to the instruction from the controller 201. For example, in FIG. 16, the gate driver $G_{D1}$ supplies the current to a gate terminal of the switching device $P_{D1}$. The gate driver $G_{D2}$ supplies the current to the switching device $P_{D2}$ in response to the instruction from the controller 201. For example, in FIG. 16, the gate driver $G_{D2}$ supplies the current to a gate terminal of the switching device $P_{D2}$.

The switching device $P_{D1}$ performs switching based on the current supplied from the gate driver $G_{D1}$. The switching device $P_{D2}$ performs switching based on the current supplied from the gate driver $G_{D2}$. A direct current is generated by the switching of the switching devices $P_{D1}$ and $P_{D2}$. The direct current is adjusted by the diodes $D_{D1}$ and $D_{D2}$ and the capacitor $C_D$, and the adjusted current is output as an output current to the load 30.

The power converter 200 according to the present embodiment has been described above. Modifications of the power converter 200 can be variously implemented and embodied. For example, any of the modifications and the arrangement examples described in the first embodiment is applicable to each of the electronic circuits 100$a$ and 100$b$ provided in the power converter 200. The power converter 200 according to the present embodiment causes the electronic circuit 100$a$ to operate as the current measurement device, and causes the electronic circuit 100$b$ to operate as the voltage measurement device. As a result, the output direct current can be controlled based on the input current and the input voltage of the power converter 200. Even in a case where the input current and the input voltage of the power converter 200 and the reference potential GND1 are steeply varied, using the electronic circuits 100$a$ and 100$b$ makes it possible to protect the internal circuits of the electronic circuits 100$a$ and 100$b$ from destruction caused by potential difference. The electronic circuits 100$a$ and 100$b$ each have high CMTI characteristics, which reduce the noise of the signals representing the input current and the input voltage transmitted to the controller 201. As a result, the controller 201 can more accurately instruct the gate drivers $G_{D1}$ and $G_{D2}$.

Third Embodiment

Figure 17:
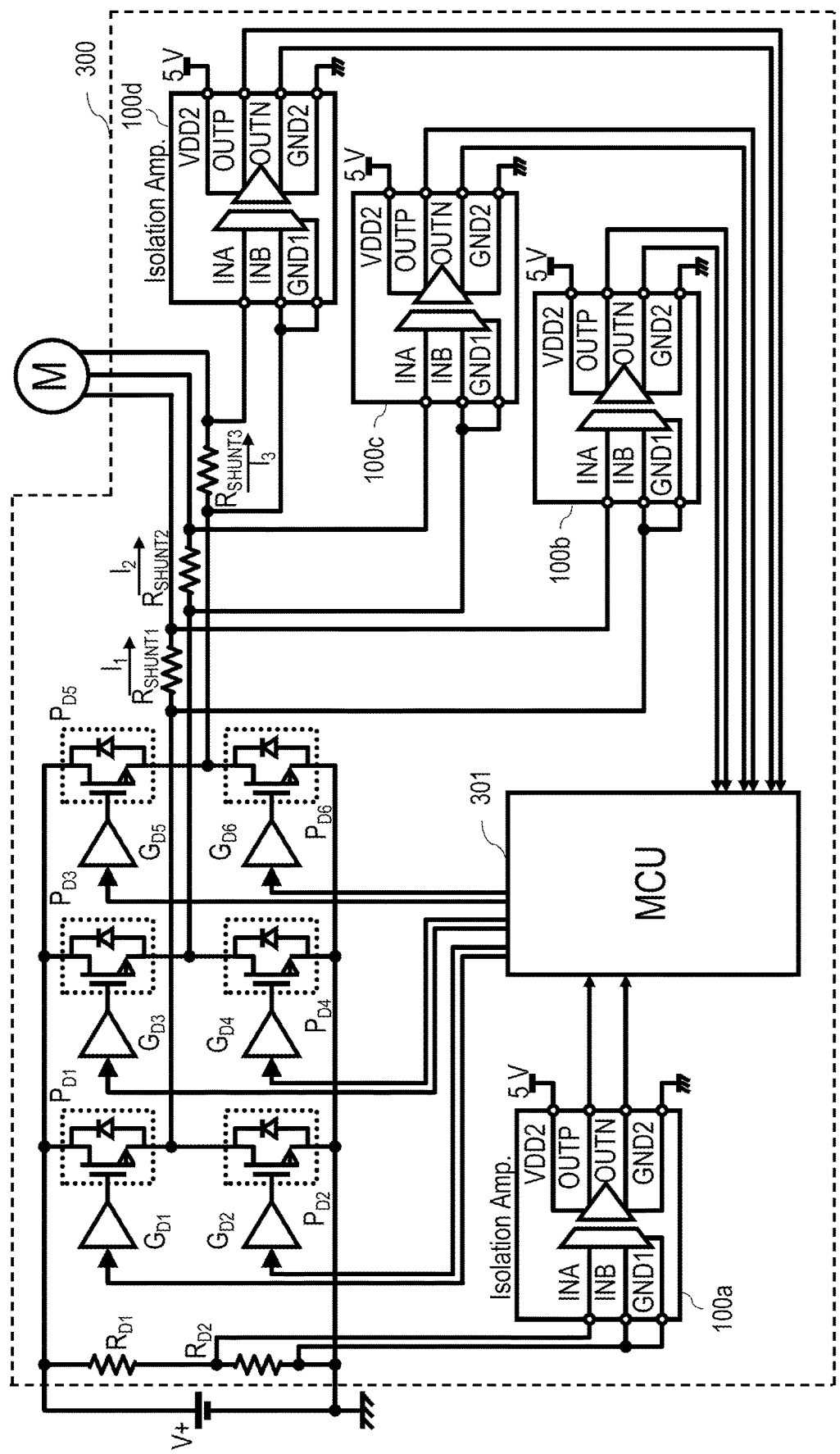
FIG. 17 is a configuration diagram of an inverter 300 according to a third embodiment.

In a third embodiment, an application example using the electronic circuit 100 described in the first embodiment is described. FIG. 17 is a configuration diagram of an inverter 300 using the electronic circuit 100. The inverter 300 is, for example, a three-phase inverter supplying a current to a motor M. The inverter 300 includes electronic circuits 100$a$, 100$b$, 100$c$, and 100$d$, a controller 301 (illustrated as MCU in drawing), resistors $R_{D1}$, $R_{D2}$, $R_{SHUNT1}$, $R_{SHUNT2}$, and $R_{SHUNT3}$, gate drivers $G_{D1}$, $G_{D2}$, $G_{D3}$, $G_{D4}$, $G_{D5}$, and $G_{D6}$, and switching devices $P_{D1}$, $P_{D2}$, $P_{D3}$, $P_{D4}$, $P_{D5}$, and $P_{D6}$.

Each of the electronic circuits 100$a$, 100$b$, 100$c$, and 100$d$ is similar to the electronic circuit 100 described in the first embodiment. The input terminal INA of the electronic circuit 100$a$ is connected between the resistors $R_{D1}$ and $R_{D2}$, and the input terminal INB of the electronic circuit 100$a$ is connected to an end of the resistor $R_{D2}$ opposite to an end connected to the resistor $R_{D1}$. The resistors $R_{D1}$ and $R_{D2}$ divide an input voltage "V+" to the inverter 300. A voltage at the end of the resistor $R_{D2}$ connected to the resistor $R_{D1}$ is input as the input signal $S_{INA}$ of the electronic circuit 100$a$, and a voltage at the other end of the resistor $R_{D2}$ is input as the input signal $S_{INB}$ of the electronic circuit 100$a$. The electronic circuit 100$a$ operates as a voltage measurement device measuring the input voltage "V+" of the inverter 300. The electronic circuit 100$a$ finally transmits signals representing the input voltage "V+" of the inverter 300, as the restoration signals $S_{A3}$ and $S_{B3}$ to the controller 301.

The input terminal INA of the electronic circuit 100$b$ is connected one end of the resistor $R_{SHUNT1}$, and the input terminal INB of the electronic circuit 100$b$ is connected to the other end of the resistor $R_{SHUNT1}$. The resistor $R_{SHUNT1}$ converts an output current "$I_1$" generated by the switching devices $P_{D1}$ and $P_{D2}$ into a voltage. A voltage at one end of the resistor $R_{SHUNT1}$ is input as the input signal $S_{INA}$ of the electronic circuit 100b, and a voltage at the other end of the resistor $R_{SHUNT1}$ is input as the input signal $S_{INB}$ of the electronic circuit 100b. The electronic circuit 100b operates as a current measurement device measuring the output current "$I_1$" generated by the switching devices $P_{D1}$ and $P_{D2}$. The electronic circuit 100b finally transmits signals representing the output current "$I_1$", as the restoration signals $S_{A3}$ and $S_{B3}$ to the controller 301.

The input terminal INA of the electronic circuit 100c is connected to one end of the resistor $R_{SHUNT2}$, and the input terminal INB of the electronic circuit 100c is connected to the other end of the resistor $R_{SHUNT2}$. The resistor $R_{SHUNT2}$ converts an output current "$I_2$" generated by the switching devices $P_{D3}$ and $P_{D4}$ into a voltage. A voltage at one end of the resistor $R_{SHUNT2}$ is input as the input signal $S_{INA}$ of the electronic circuit 100c, and a voltage at the other end of the resistor $R_{SHUNT2}$ is input as the input signal $S_{INB}$ of the electronic circuit 100c. The electronic circuit 100c operates as a current measurement device measuring the output current "$I_2$" generated by the switching devices $P_{D3}$ and $P_{D4}$. The electronic circuit 100c finally transmits signals representing the output current "$I_2$", as the restoration signals $S_{A3}$ and $S_{B3}$ to the controller 301.

The input terminal INA of the electronic circuit 100d is connected one end of the resistor $R_{SHUNT3}$, and the input terminal INB of the electronic circuit 100d is connected to the other end of the resistor $R_{SHUNT3}$. The resistor $R_{SHUNT3}$ converts an output current "$I_3$" generated by the switching devices $P_{D5}$ and $P_{D6}$ into a voltage. A voltage at one end of the resistor $R_{SHUNT3}$ is input as the input signal $S_{INA}$ of the electronic circuit 100d, and a voltage at the other end of the resistor $R_{SHUNT3}$ is input as the input signal $S_{INB}$ of the electronic circuit 100d. The electronic circuit 100d operates as a current measurement device measuring the output current "$I_3$" generated by the switching devices $P_{D5}$ and $P_{D6}$. The electronic circuit 100d finally transmits signals representing the output current "$I_3$", as the restoration signals $S_{A3}$ and $S_{B3}$ to the controller 301.

The controller 301 determines a current supplied from the gate driver $G_{D1}$ to the switching device $P_{D1}$, a current supplied from the gate driver $G_{D2}$ to the switching device $P_{D2}$, a current supplied from the gate driver $G_{D3}$ to the switching device $P_{D3}$, a current supplied from the gate driver $G_{D4}$ to the switching device $P_{D4}$, a current supplied from the gate driver $G_{D5}$ to the switching device $P_{D5}$, and a current supplied from the gate driver $G_{D6}$ to the switching device $P_{D6}$, by using the signals representing the input voltage and the signals representing the output currents "$I_1$", "$I_3$", and "$I_3$" of the inverter 300, transmitted from the electronic circuits 100a to 100d. The controller 301 instructs the gate drivers $G_{D1}$ to $G_{D6}$ to supply the respective determined currents. In the present embodiment, as an example, the controller 301 is an MCU (Micro Control Unit); however, an optional processing IC is applicable.

The gate drivers $G_{D1}$ to $G_{D6}$ supply the currents to the respective switching devices $P_{D1}$ to $P_{D6}$ in response to the instruction from the controller 301. The gate drivers $G_{D1}$ to $G_{D6}$ are provided corresponding to the respective switching devices $P_{D1}$ to $P_{D6}$, and supply the currents instructed by the controller 301 to the respective corresponding switching devices. For example, in FIG. 17, the gate driver $G_{D1}$ supplies the current instructed by the controller 301 to a gate terminal of the switching device $P_{D1}$. The gate driver $G_{D2}$ supplies the current instructed by the controller 301 to a gate terminal of the switching device $P_{D2}$. The gate driver $G_{D3}$ supplies the current instructed by the controller 301 to a gate terminal of the switching device $P_{D3}$. The gate driver $G_{D4}$ supplies the current instructed by the controller 301 to a gate terminal of the switching device $P_{D4}$. The gate driver $G_{D5}$ supplies the current instructed by the controller 301 to a gate terminal of the switching device $P_{D5}$. The gate driver $G_{D6}$ supplies the current instructed by the controller 301 to a gate terminal of the switching device $P_{D6}$.

The switching devices $P_{D1}$ to $P_{D6}$ perform switching based on the currents supplied from the respective connected gate drivers $G_{D1}$ to $G_{D6}$. The output currents are generated by the switching of the switching devices $P_{D1}$ to $P_{D6}$. For example, the output current "$I_1$" is generated by the switching of the switching devices $P_{D1}$ and $P_{D2}$, the output current "$I_2$" is generated by the switching of the switching devices $P_{D3}$ and $P_{D4}$, and the output current "$I_3$" is generated by the switching of the switching devices $P_{D5}$ and $P_{D6}$. The generated output currents "$I_1$" to "$I_3$" are output to the motor M and drive the motor M.

The inverter 300 according to the present embodiment has been described above. Modifications of the inverter 300 can be variously implemented and embodied. For example, any of the modifications and the arrangement examples described in the first embodiment is applicable to each of the electronic circuits 100a to 100d provided in the inverter 300. Further, the resistors $R_{D1}$ and $R_{D2}$, the gate drivers $G_{D1}$ and $G_{D2}$, and the switching device $P_{D1}$ and $P_{D2}$ described in the present embodiment may be similar to or different from those described in the second embodiment.

The inverter 300 according to the present embodiment causes the electronic circuit 100a to operate as the voltage measurement device, and causes the electronic circuits 100b to 100d to operate as the current measurement devices. As a result, the output currents "$I_1$" to "$I_3$" can be controlled based on the input voltage and the output currents "$I_1$" to "$I_3$" of the inverter 300. Even in a case where the input voltage and the output currents "$I_1$" to "$I_3$" of the inverter 300 and the reference potential GND1 are steeply varied, using the electronic circuits 100a to 100d makes it possible to protect the internal circuits of the electronic circuits 100a to 100d from destruction caused by potential difference. The electronic circuits 100a to 100d each have high CMTI characteristics, which reduces the noise of the signals representing the input voltage and the signals representing the output currents "$I_1$" to "$I_3$" of the inverter 300, transmitted to the controller 301. As a result, the controller 301 can more accurately instruct the gate drivers $G_{D1}$ to $G_{D6}$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit comprising:
   a generation circuit configured to generate a first clock signal and a second clock signal delayed from the first clock signal;
   a first electromagnetic field coupler configured to transmit one of the first clock signal and the second clock signal by electromagnetic field coupling;

a first frequency converter driven by the one of the first clock signal and the second clock signal, and configured to convert a first input signal into a first signal of a frequency corresponding to one of the first clock signal and the second clock signal;

a second electromagnetic field coupler configured to transmit the first signal by electromagnetic field coupling;

a second frequency converter configured to convert the first signal into a second signal of a frequency corresponding to the first input signal, by using the other of the first clock signal and the second clock signal;

an output terminal configured to output the second signal; and a first protection circuit connected to a first line through which the one of the first clock signal and the second clock signal is transmitted between the first electromagnetic field coupler and the first frequency converter.

2. The electronic circuit according to claim 1, wherein the first protection circuit operates based on at least one of variation of an intermediate potential of the first input signal and variation of a reference potential of the electronic circuit.

3. The electronic circuit according to claim 2, wherein the first protection circuit does not operate by variation of a voltage of the first clock signal, variation of a voltage of the second clock signal, and variation of a differential voltage of the first input signal.

4. The electronic circuit according to claim 1, wherein the first protection circuit includes a first transistor and a second transistor connected in parallel with the first transistor, the first transistor including a first gate terminal and a first drain terminal connected to each other, the second transistor including a second gate terminal and a first source terminal connected to each other.

5. The electronic circuit according to claim 4, wherein the first protection circuit further includes a third transistor connected in series with the first transistor, and a fourth transistor connected in series with the second transistor, the third transistor including a third gate terminal and a second drain terminal connected to each other, the fourth transistor including a fourth gate terminal and a second source terminal connected to each other.

6. The electronic circuit according to claim 1, wherein the first protection circuit includes a first transistor and a second transistor, the first transistor including a first gate terminal and a first drain terminal, the second transistor including a second gate terminal connected to the first drain terminal, and a second drain terminal connected to the first gate terminal.

7. The electronic circuit according to claim 6, wherein the first protection circuit further includes a third transistor connected in series with the first transistor, and a fourth transistor connected in series with the second transistor, the third transistor including a third gate terminal connected to the first gate terminal and the second drain terminal, the fourth transistor including a fourth gate terminal connected to the second gate terminal and the first drain terminal.

8. The electronic circuit according to claim 1, further comprising a second protection circuit connected to a second line through which the first signal is transmitted between the first frequency converter and the second electromagnetic field coupler.

9. The electronic circuit according to claim 1, further comprising:

an input terminal receiving the first input signal; and a third protection circuit connected to a third line through which the first input signal is transmitted between the input terminal and the first frequency converter.

10. The electronic circuit according to claim 1, further comprising a control circuit configured to determine a delay amount of the first clock signal based on an amplitude of the second signal.

11. The electronic circuit according to claim 10, wherein the control circuit determines the delay amount of the first clock signal based on a maximum value of the amplitude of the second signal.

12. The electronic circuit according to claim 1, wherein each of the first electromagnetic field coupler and the second electromagnetic field coupler includes at least one of a capacitor and a transformer, and each of the first electromagnetic field coupler and the second electromagnetic field coupler performs electromagnetic field coupling through an isolation barrier electrically isolated.

13. The electronic circuit according to claim 1, wherein the electronic circuit includes a first chip and a second chip, the first chip includes the first electromagnetic field coupler, the second electromagnetic field coupler, and the first frequency converter, and the second chip includes the second frequency converter.

14. The electronic circuit according to claim 1, wherein the electronic circuit includes at least a first chip and a second chip, the first chip includes the first electromagnetic field coupler, the second electromagnetic field coupler, and the second frequency converter, and the second chip includes the first frequency converter.

15. The electronic circuit according to claim 1, further comprising:

a third electromagnetic field coupler connected to the first electromagnetic field coupler and configured to transmit the one of the first clock signal and the second clock signal by electromagnetic field coupling; and a fourth electromagnetic field coupler connected to the second electromagnetic field coupler and configured to transmit the first signal by electromagnetic field coupling, wherein the electronic circuit includes at least a first chip and a second chip, the first chip includes the first electromagnetic field coupler and the second electromagnetic field coupler, and the second chip includes the third electromagnetic field coupler and the fourth electromagnetic field coupler.

16. An electronic apparatus comprising:

the electronic circuit according to claim 1; and a first resistor configured to convert an input current or an output current of an electronic apparatus or an electric apparatus into a voltage, wherein the input signal includes a first voltage signal representing a voltage at a first end of the first resistor and a second voltage signal representing a voltage at a second end of the first resistor, and the second signal includes a signal representing the input current or the output current.

17. An electronic apparatus comprising:

the electronic circuit according to claim 1; and a second resistor and a third resistor configured to divide an input voltage of an electronic apparatus or an electric apparatus, wherein the input signal includes a third voltage signal representing a voltage at a first end of the third resistor connected to the second resistor and a fourth voltage signal representing a voltage at a second end of the third resistor, and the second signal includes a signal representing the input voltage.

18. An electronic apparatus comprising:

the electronic apparatus according to claim 16, configured to measure the input current;

the electronic apparatus according to claim 17;

a switching device configured to generate a direct current;

a gate driver configured to generate a current supplied to the switching device; and a controller configured to determine the current generated by the gate driver based on a signal representing a value of the input current and a signal representing a value of the input voltage.

19. An electronic apparatus comprising:

a plurality of the electronic apparatus according to claim 16, each configured to measure the output current;

the electronic apparatus according to claim 17;

a plurality of switching devices configured to generate the output current;

a plurality of gate drivers provided corresponding to the plurality of switching devices and each configured to generate a current supplied to the corresponding switching device; and a controller configured to determine the output currents generated by the respective gate drivers based on a signal representing a value of the output current and a signal representing a value of the input voltage.

* * * * *